United States Patent
Yu et al.

(10) Patent No.: US 9,331,021 B2
(45) Date of Patent: May 3, 2016

(54) CHIP-ON-WAFER PACKAGE AND METHOD OF FORMING SAME

(71) Applicant: Taiwan Semiconductor Manufacturing Company, Ltd., Hsin-Chu (TW)

(72) Inventors: Chen-Hua Yu, Hsin-Chu (TW);
Ming-Fa Chen, Taichung (TW);
Sung-Feng Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/473,375

(22) Filed: Aug. 29, 2014

(65) Prior Publication Data

US 2015/0318246 A1 Nov. 5, 2015

Related U.S. Application Data

(63) Continuation-in-part of application No. 14/444,681, filed on Jul. 28, 2014.

(60) Provisional application No. 61/986,653, filed on Apr. 30, 2014, provisional application No. 61/991,287, filed on May 9, 2014.

(51) Int. Cl.
| | |
|---|---|
| *H01L 23/02* | (2006.01) |
| *H01L 23/538* | (2006.01) |
| *H01L 23/00* | (2006.01) |
| *H01L 23/31* | (2006.01) |
| *H01L 21/768* | (2006.01) |
| *H01L 21/56* | (2006.01) |
| *H01L 25/065* | (2006.01) |
| *H01L 25/00* | (2006.01) |

(52) U.S. Cl.
CPC .......... *H01L 23/5384* (2013.01); *H01L 21/563* (2013.01); *H01L 21/76807* (2013.01); *H01L 21/76831* (2013.01); *H01L 21/76877* (2013.01); *H01L 21/76898* (2013.01); *H01L 23/3157* (2013.01); *H01L 23/5386* (2013.01); *H01L 24/03* (2013.01); *H01L 24/06* (2013.01); *H01L 24/89* (2013.01); *H01L 25/0657* (2013.01); *H01L 25/50* (2013.01); *H01L 2224/024* (2013.01); *H01L 2224/0212* (2013.01); *H01L 2224/02371* (2013.01); *H01L 2224/02372* (2013.01); *H01L 2224/02373* (2013.01); *H01L 2224/02379* (2013.01); *H01L 2225/06548* (2013.01)

(58) Field of Classification Search
USPC ......... 257/686, 774, 531, 532, 721, 723, 738, 257/E21.002, E21.499, E23.011, E23.023, 257/E23.172; 438/106, 109, 125, 107, 108, 438/667
See application file for complete search history.

(56) References Cited

U.S. PATENT DOCUMENTS

| | | | |
|---|---|---|---|
| 9,059,109 B2 * | 6/2015 | Lin | ............ H01L 21/565 |
| 2011/0133339 A1 | 6/2011 | Wang | |
| 2011/0204505 A1 | 8/2011 | Pagaila et al. | |
| 2014/0264933 A1 | 9/2014 | Yu et al. | |

* cited by examiner

*Primary Examiner* — Telly Green
(74) *Attorney, Agent, or Firm* — Slater & Matsil, L.L.P.

(57) ABSTRACT

A package according to an embodiment includes a first device package and a fan-out RDL disposed over the first device package. The fan-out RDL extends past edges of the first device package. The first device package comprises a first die having a first redistribution layer (RDL) disposed on a first substrate, a second die having a second RDL disposed on a second substrate, an isolation material over the first die and extending along sidewalls of the second die, and a conductive via. The first RDL is bonded to the second RDL, and the first die and the second die comprise different lateral dimensions. At least a portion of the conductive via extends from a top surface of the isolation material to contact a first conductive element in the first RDL.

20 Claims, 50 Drawing Sheets

CHIP-ON-WAFER PACKAGE AND METHOD OF FORMING SAME

PRIORITY CLAIM AND CROSS-REFERENCE

This application claims the benefit of U.S. Provisional Application No. 61/986,653, filed on Apr. 30, 2014, titled "3D Chip-on-Wafer-on-Substrate," of U.S. Provisional Application No. 61/991,287, filed on May 9, 2014, titled "3D Chip-on-Wafer-on-Substrate Structure with Via Last Process," and of U.S. patent application Ser. No. 14/444,681, filed on Jul. 28, 2014, titled "3D Chip-on-Wafer-on-Substrate with Via Last Process," which applications are hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
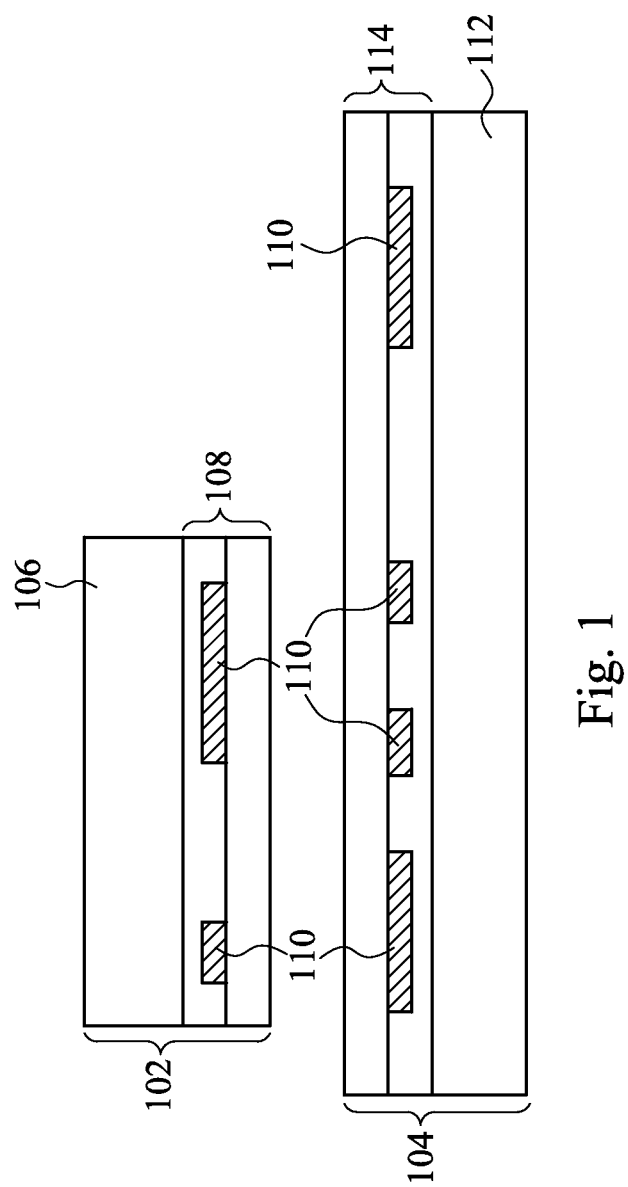
FIGS. 1-15 illustrate cross-sectional views of intermediate processing steps in forming a chip-on-wafer structure using a via last process according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices are bonded together to form packages with various capabilities. In some processes, dies, wafers or a combination of dies and wafers, are bonded together using direct surface bonding such as oxide-to-oxide bonding, through hybrid bonding, fusion bonding, or the like. Interconnections between bonded wafers can be provided using a via last process. In the via last process, the vias are formed through one of the dies after the dies have been bonded to provide electrical connection between the dies and external connectors using a self-aligning insulating spacer on the sidewalls of the via openings. The self-aligning spacer on the sidewalls permits narrower, taller vias, and improves the aspect ratio of the vias to between about 3 and about 10. The improved aspect ratio results in more compactly arranged via arrays.

It has further been discovered that the via last process permits stacking of numerous dies, as connectivity between dies in a package, or between dies and external connectors can be provided by embodiments of the via last processes disclosed herein. Vias are formed after bonding each die or layer of dies. Vias are formed to connect to a previously bonded die, or to a previously formed via in a lower die. Additional structures, such as fan-out redistribution layers (RDLs) may be formed over the bonded stacked dies, and external connectors are provided RDLs. The external connectors connect the vias to a power source or providing communication with another die, substrate, interposer, printed circuit board, package, or the like through the various fan-out RDLs.

FIG. 1 illustrates a cross-sectional view of a wafer 104 and die 102 prior to bonding according to an embodiment. A die 102 comprises a die substrate 106 such as a semiconductor having one or more active devices formed therein. A die redistribution layer (RDL) 108 is disposed on the die substrate 106. The die RDL 108 comprises one or more dielectric layers with conductive elements 110 disposed in the dielectric layers. The die RDL 108 is formed over the side of the substrate having the active devices, with the conductive elements 110 connecting to the active devices on the die substrate 106.

The wafer 104 has a wafer RDL 114 disposed over a wafer substrate 112. In some embodiments, the wafer substrate 112 is a semiconductor with one or more active devices formed therein. The wafer RDL 114 is formed over the active devices in the wafer substrate 112 and has one or more conductive elements 110 disposed in dielectric layers.

Figure 2:
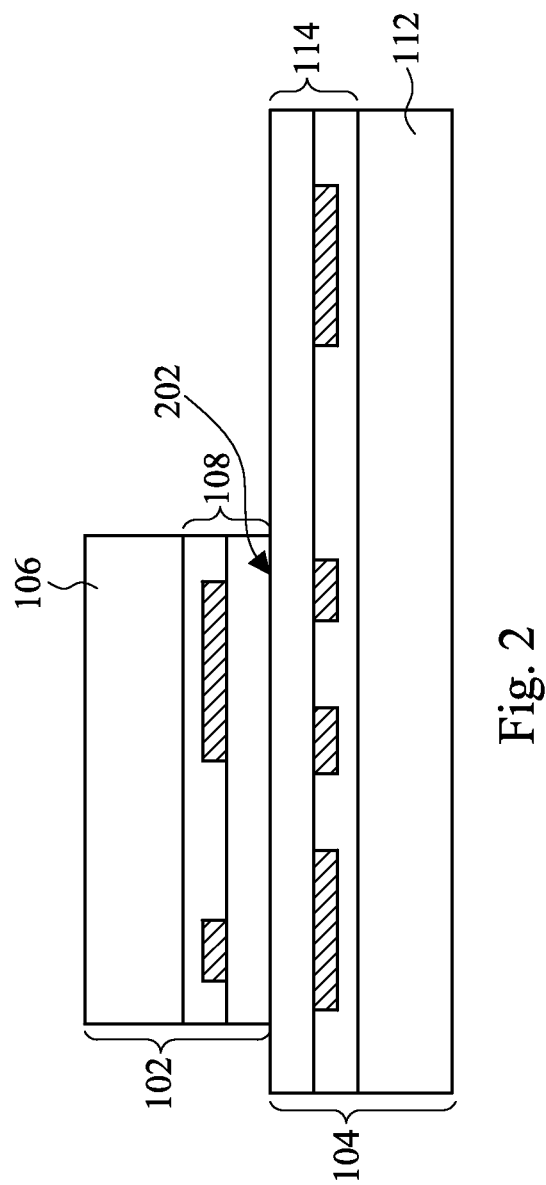

FIG. 2 illustrates a cross-sectional view of a processing step for bonding a wafer according to an embodiment. The die 102 and wafer 104 are bonded at the top surfaces of the RDLs 108 and 114, forming a bond interface 202. The die 102 and wafer 104 are used as the basis for a package having connections for mounting the package to external devices, substrates, or the like. In some embodiments, the die 102 is bonded to the wafer 104 by, for example, direct surface bonding, metal-to-metal bonding, hybrid bonding, or another bonding process. A direct surface bonding process creates an oxide-to-oxide bond or substrate-to-substrate bond through a cleaning and/or surface activation process followed by applying pressure, heat and/or other bonding process steps to the joined surfaces. In oxide-to-oxide bonding applications, the interface between die 102 and wafer 104 may be substantially free of any conductive elements. In other embodiments, the die 102 and wafer 104 are bonded by metal-to-metal bonding that is achieved by fusing conductive elements 110, such as metal bond pads, exposed at the surfaces of the RDLs 108 and 114. In other embodiments, hybrid bonding is used to bond the die 102 and wafer 104 by a combination of direct surface bonding and metal-to-metal bonding, where both the surfaces of the RDLs 108 and 114 and the surfaces of metal bond pads exposed at the surfaces of the RDLs 108 and 114 are bonded. In some embodiments, the bonded dies are baked, annealed, pressed, or otherwise treated to strengthen or finalize the bond.

Figure 3:
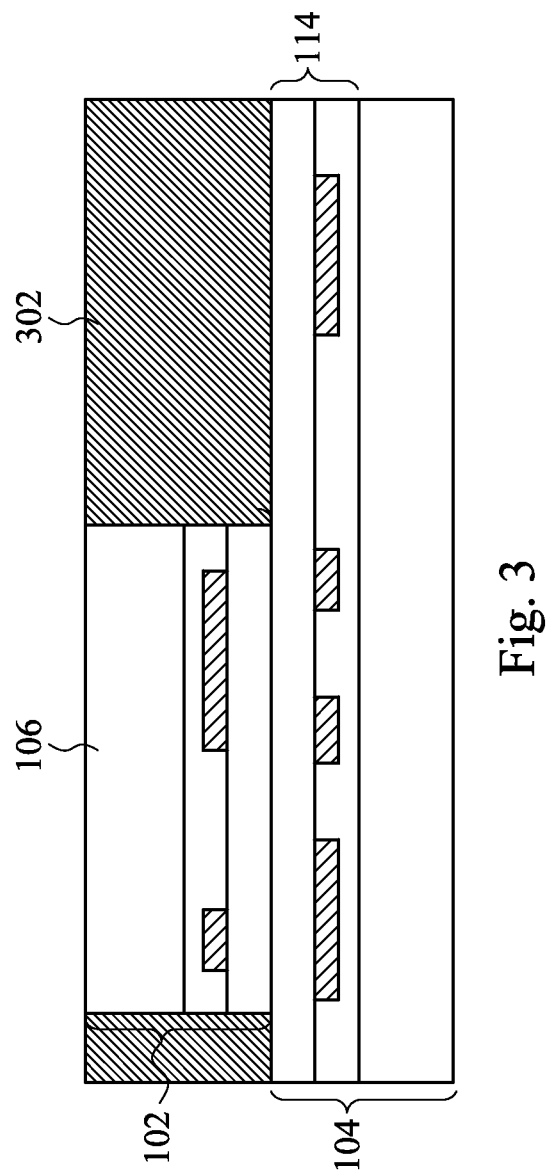

FIG. 3 is a cross-sectional view of forming isolation material 302 over the package according to an embodiment. The isolation material 302 is formed around the die 102 and on the wafer RDL 114. In some embodiments, isolation material 302 comprises a molding compound shaped or molded using for example, a mold (not shown) which may have a border or other feature for retaining isolation material 302 when applied. Such a mold may be used to pressure mold the isolation material 302 around the die 102 to force the isolation material 302 into openings and recesses, eliminating air pockets or the like in the isolation material 302. Subsequently, a curing process is performed to solidify isolation material 302. In an embodiment, the isolation material 302 is a nonconductive or dielectric material, such as an epoxy, a resin, a moldable polymer such as PBO, or another moldable material. For example, isolation material 302 is an epoxy or resin that is cured through a chemical reaction or by drying. In another embodiment, the isolation material 302 is an ultraviolet (UV) cured polymer. Other suitable processes, such as transfer molding, liquid encapsulent molding, and the like, may be used to form isolation material 302.

In other embodiments, isolation material 302 comprises a dielectric or other insulating film comprising an oxide, nitride or the like. In some embodiments, the oxide or nitride insulating film is a silicon nitride, silicon oxide, silicon oxynitride, or another dielectric material, and is formed by chemical vapor deposition (CVD), plasma enhanced CVD (PECVD), or another process.

After the isolation material 302 is formed over the die 102 and wafer 104, the isolation material 302 is reduced or planarized by, for example, grinding, a chemical-mechanical polish (CMP), etching or another process. For example, where the isolation material 302 is an insulating film such as an oxide or nitride, a dry etch or CMP is used to reduce or planarized the top surface of the isolation material In some embodiments, the isolation material 302 extends over the die 102 after planarization, and in other embodiments, the isolation material is reduced so that the die 102 is exposed. The die substrate 106 is, in some embodiments, thinned or reduced in the same process as the isolation material, resulting in a die 102 backside surface that is substantially planar with the isolation material surface.

Figure 4:
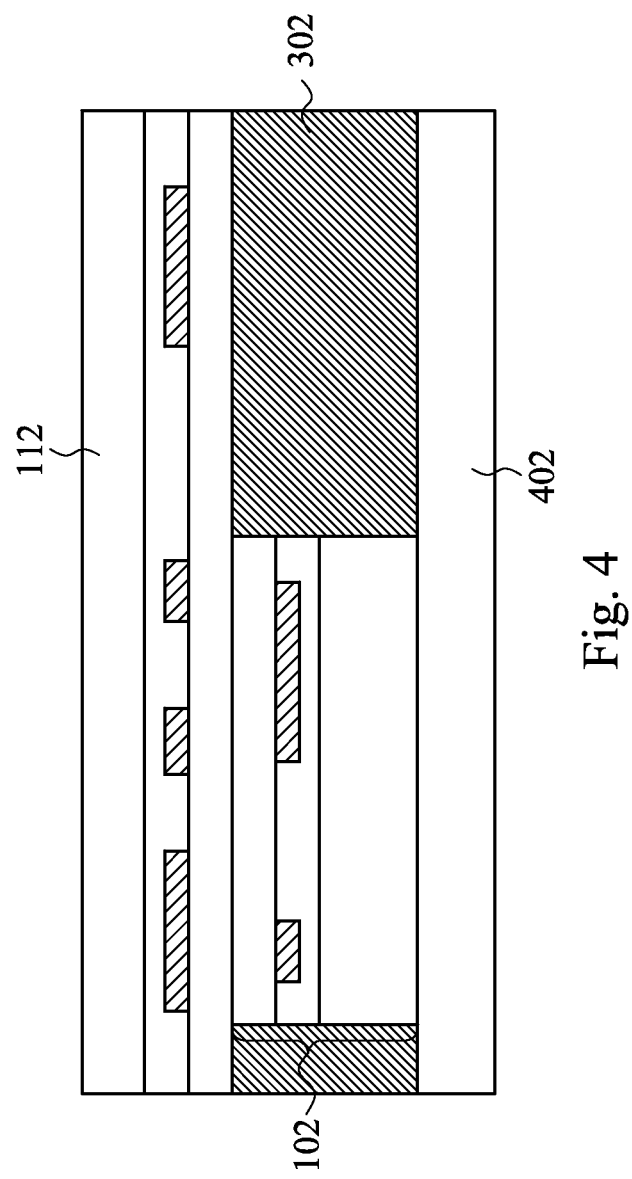

FIG. 4 is a cross-sectional view of mounting the package to a carrier 402 according to an embodiment. The package is inverted to permit access to, and processing through the wafer substrate 112. The die 102 and isolation material 302 surface are bonded to, for example, a glass carrier, or other handling substrate. The package is attached to the carrier 402 using die attachment film (DAF), an adhesive, or the like. In other embodiments, the package is attached to the carrier 402 with the wafer substrate 112 on the carrier 402, permitting processing of the package through the die side of the package. In some embodiments, the wafer substrate 112 is also thinned or reduced by grinding, CMP, etching or another process.

Figure 5:
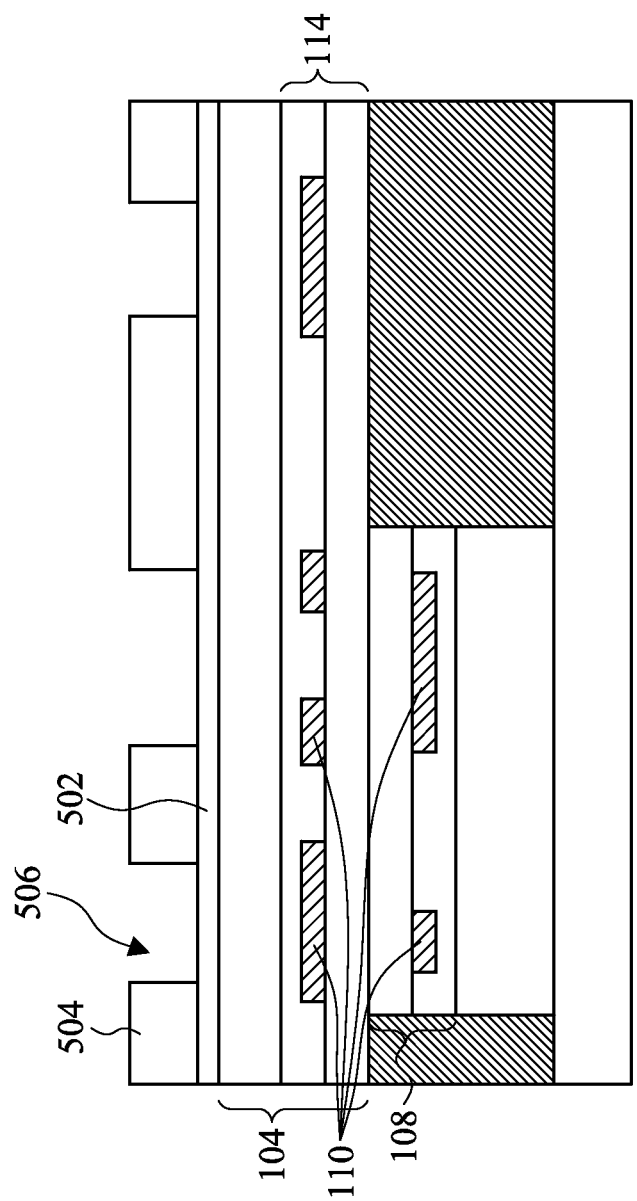

FIG. 5 is a cross-sectional view illustrating masking the wafer substrate 112 according to an embodiment. An etch stop layer 502 is formed on the wafer substrate 112, and is formed from a material that has a high etch selectivity compared to the material of the wafer substrate 112. Additionally, the etch stop layer 502 has a high etch selectivity compared to the wafer RDL 114 and die RDL 108. In some embodiments where the wafer substrate 112 is, for example, silicon and the RDLs 114 and 108 are silicon oxide, the etch stop layer 502 is a nitride such as silicon nitride (SiN), a carbide such as silicon carbide (SiC) or an oxynitride such as silicon oxynitride (SiON), or another etch stop material. In such an embodiment, the etch stop layer is deposited by deposited using chemical vapor deposition (CVD), plasma enhanced CVD (PECVD), physical vapor deposition (PVD), epitaxy, a spin-on process, or another deposition process.

A mask 504 is formed over the etch stop layer 502 and is patterned to form openings 506 exposing portions of the etch stop layer 502. The mask 504 is, in some embodiments, a photoresist that is deposited, exposed and developed. The openings 506 in the mask 504 are aligned over conductive elements 110 in the RDLs 108 and 114. In other embodiments, mask 504 may be a hard mask, in which embodiments a patterned photoresist would first be used to pattern the hard mask to achieve the structure illustrated in FIG. 5.

Figure 6:
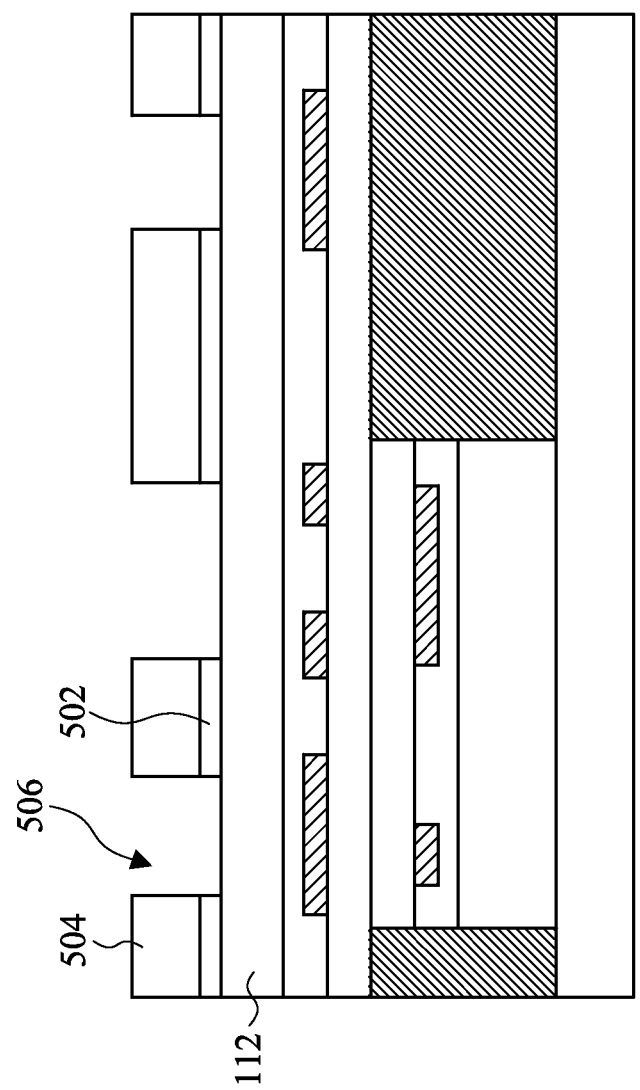

FIG. 6 is a cross-sectional view illustrating etching of the etch stop layer 502 according to an embodiment. The etch stop layer 502 is etched to expose the wafer substrate 112. In some embodiment, the etch stop layer 502 is etched with a dry plasma etch, such as an oxygen or nitrogen plasma with a fluorine based etchant such as carbon tetrafluoride ($CF_4$) or sulfur hexafluoride ($SF_6$). In other embodiments, the etch stop layer 502 is etched by a wet etch, using for example, sulfuric acid ($H_2SO_4$) heated phosphoric acid ($H_3PO_4$), or the like.

Figure 7:
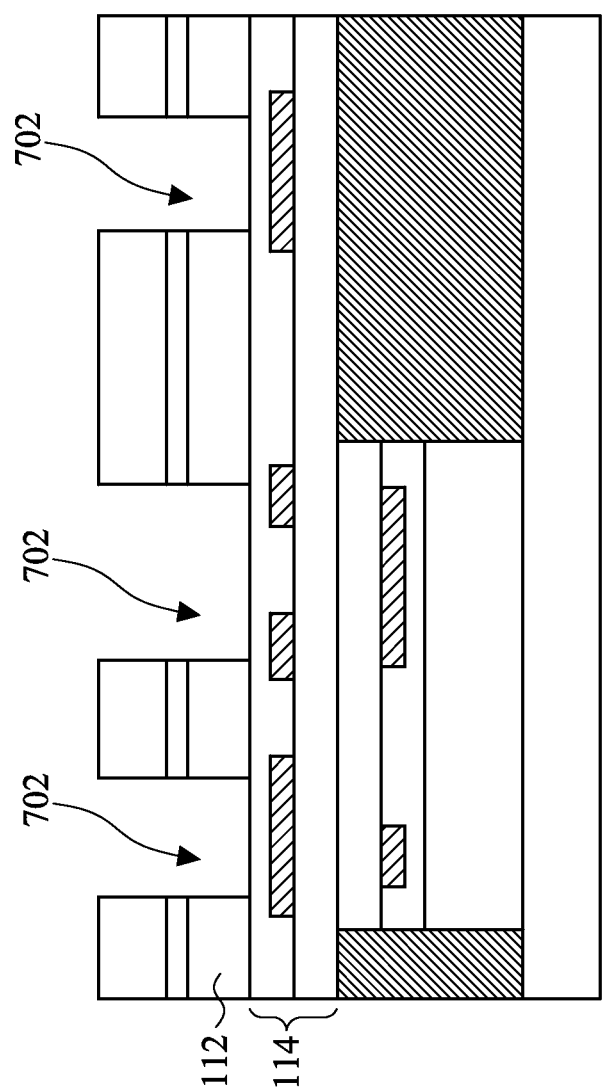

FIG. 7 is a cross-sectional view illustrating etching of the wafer substrate 112 according to an embodiment. The wafer substrate 112 is etched anisotropically to form via openings 702 with substantially vertical walls. In some embodiments, the wafer substrate 112 is etched in a separate process step from etching the etch stop layer 502, permitting the etch stop layer 502 to act as a hard mask for etching the wafer substrate 112. For example, where the wafer substrate 112 is silicon, the wafer substrate 112 is dry plasma etched with a chlorine based etchant, such as gaseous chlorine ($Cl_2$) or wet etched with potassium hydroxide (KOH) or a nitric acid/hydrofluoric acid ($HNO_3$/HF) mix. Additionally, the wafer substrate 112 is selectively etched, with the etch stopping at the wafer RDL 114.

Figure 8:
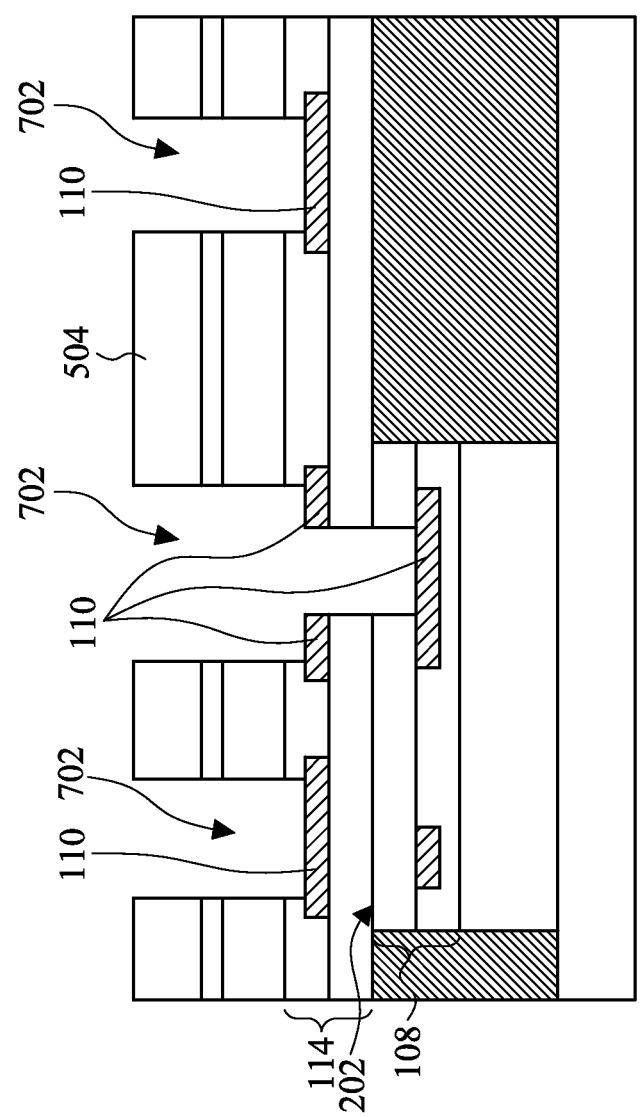

FIG. 8 is a cross-sectional view illustrating etching of the oxide layers of the RDLs 108 and 114. The oxide layers are, in an embodiment, etched using a buffered oxide etch (BOE) comprising ammonium fluoride ($NH_4F$) and hydrofluoric acid. Conductive elements 110 in the oxide layers of the RDLs 108 and 114 act as an etch stop layer, permitting etching of the RDLs 108 and 114 to different depths. Etching the oxide layers extends the via openings 702 to conductive elements 110 in the RDLs 108 and 114. In some embodiments, a via opening 702 extends through an opening in an upper conductive element 110 and exposes a surface of a lower conductive element 110. Thus, a single via opening 702 can expose surfaces of multiple conductive elements 110. Additionally, in some embodiment, the via openings 702 expose conductive elements 110 in the die RDL 108 and the wafer RDL 114.

Figure 9:
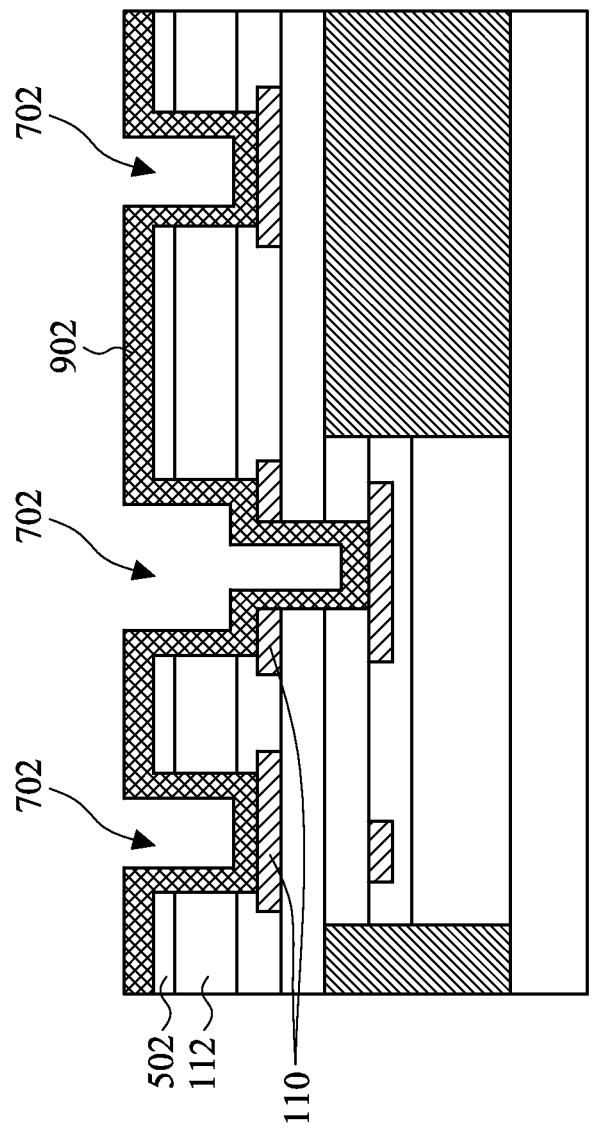

FIG. 9 is a cross-sectional view illustrating formation of an isolation layer 902 according to an embodiment. The mask 504 (see FIG. 7) is removed, and a conformal dielectric isolation layer 902 is formed over the etch stop layer 502. The isolation layer 902 extends into each of the via openings 702 and covers the sidewalls of the via openings 702, including the portions of the wafer substrate 112 exposed in the via openings 702.

In an embodiment, the isolation layer 902 is formed from silicon nitride, for example, using a CVD or PECVD process. In other embodiments, the isolation layer 902 is formed from an oxide, another nitride, a carbide, an oxynitride, spin on glass (SOG) or another dielectric or electrical insulating material. The thickness of the isolation layer 902 is determined, in part, by the intended voltage on vias that will be formed in the via openings 702. It has been determined that a thickness between about 500 angstroms and about 5000 angstroms will provide a thickness that results in a breakdown voltage that is greater than about 3.8 volts.

Figure 10:
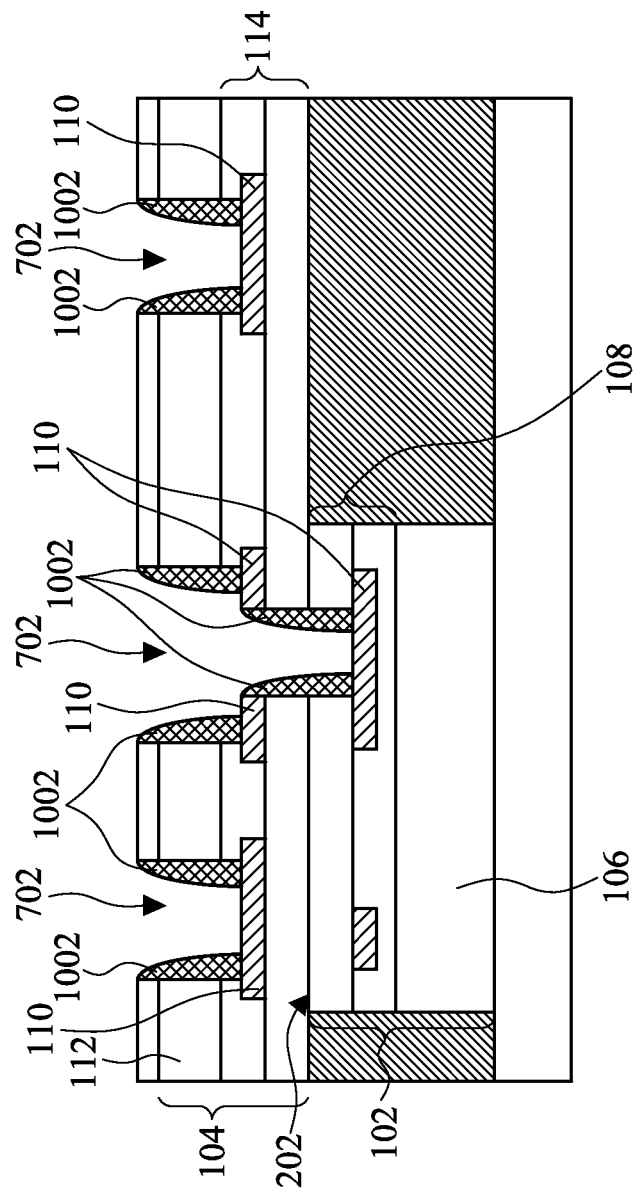

FIG. 10 is a cross-sectional view illustrating formation of self-aligning spacers 1002 according to an embodiment. The isolation layer 902 (see FIG. 9) is etched, using, for example, a dry plasma etch with chlorine, sulfur hexafluoride, carbon tetrafluoride, chlorine or another etchant in an argon (Ar), helium (He) or other environment. In some embodiments, the etchant is provided with, for example, oxygen ($O_2$), nitrogen ($N_2$) or other process gasses to increase the selectivity of the etch. In such an etch, the environment is maintained between about 25° C. and about 150° C. at a pressure between about 10 mtorr and about 200 mtorr. In some embodiments, the etch is anisotropic, removing material in a vertical direction. Thus, the etch removes material of the isolation layer 902 from the horizontal surfaces of the package, leaving spacers 1002 on the sidewall surfaces of the package. For example, portions of the isolation layer 902 disposed on the etch stop layer 502 are removed while portions of the isolation layer 902 disposed on the sidewalls of the via openings 702 remain. This is due to the thickness of the isolation layer 902 in the vertical direction being greater where at the sidewalls than at the horizontal surfaces. Additionally, the portions of the top surfaces of the conductive elements 110 are exposed during the etch. This is due to the isolation material being removed substantially from the top direction, as the directional etching of the isolation layer 902 reduces the top surface of the isolation layer 902, eliminating the lateral portions of the isolation layer 902 and leaving the vertical portions.

It has been discovered that self-aligning spacers 1002 can be formed within the via openings 702, and that the self-aligning feature of the spacers 1002 causes the spacers 1002 to form on the sidewalls of the via openings 702. The spacers 1002 insulate the material forming the sidewalls of the via openings 702 from vias formed in the via openings 702. In particular, the spacers 1002 form on the sidewalls of the via openings 702 where the via opening 702 passes through the wafer substrate 112, with the outer surfaces of the spacers 1002 disposed on the sidewalls of the via openings 702, and with the inner surfaces of the spacers 1002 facing the interior of the via openings 702. The spacers 1002 permit a conductive via to be formed in the via opening 702 while avoiding electrical contact with the vertical surfaces of the wafer substrate 112 and RDLs 108 and 114. In some embodiments, the spacers 1002 extend to an underlying conductive feature 110, shielding the via opening 702 from all of the sidewalls of the via openings 702. Additionally, the spacers 1002 leave portions of the lateral surfaces of the conductive elements 110 exposed in the via openings 702 so that a subsequently formed via can come into electrical contact with the conductive features 110. Thus, some of the spacers extend below the bottommost surface of the wafer substrate 112 into the RDLs 108 and 114, with the inner surfaces of the spacers 1002 extending contiguously from the conductive element 1002 to the top surface of the wafer substrate 112, or over the top surface of the wafer substrate.

In some embodiments where a via opening 702 is formed over or through an upper conductive element 110 to a lower conductive element 110, the via opening 702 has an upper portion with a wider width than a lower portion of the via opening 702. In such an embodiment, separate spacers 1002 are formed on the sidewalls of the upper and lower portions of the via openings 702, with the upper and lower spacer 1002 laterally spaced apart to expose the lateral surfaces of the upper conductive element 110.

Figure 11:
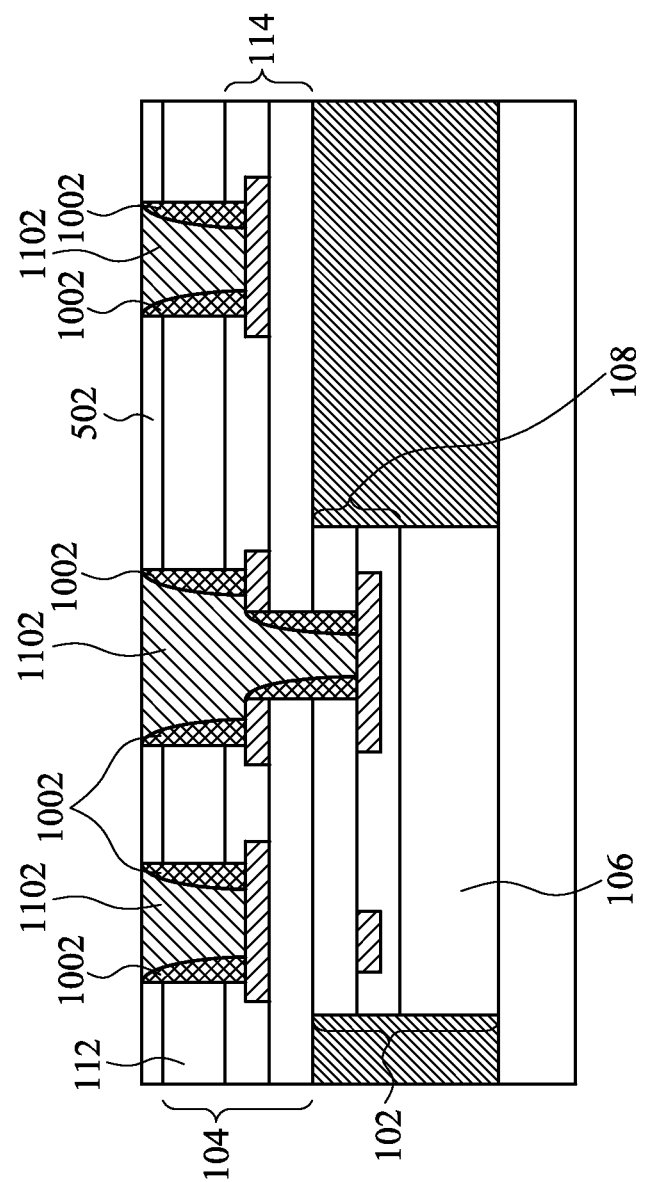

FIG. 11 is a cross-sectional view illustrating formation of vias 1102 in the via openings 702 according to an embodiment. As the vias 1102 are formed after bonding the die 102 to the wafer 104, this process is referred to as a via last process. In some embodiments, vias 1102 that extend through a substrate such as the wafer substrate 112 are referred to as through substrate vias (TSVs) or alternatively, as through silicon vias for vias extending through a silicon substrate. Vias 1102 that extend through the isolation material 302 are referred to as through dielectric vias (TDVs).

In some embodiments, a barrier layer (not shown for clarity) is formed in the via openings 702, with the barrier layer formed from, for example, cobalt (Co), tantalum, tungsten, tantalum nitride (TaN), titanium nitride (TiN), or the like by CVD, PECVD or another deposition process. Vias 1102 are created by filling the via openings 702 with a conductive material such as copper (Cu) aluminum (Al), aluminum copper alloy (AlCu), gold, titanium, cobalt, an alloy, or another conductive material. In some embodiments, the vias are formed through, for example, electrochemical plating (ECP), electroplating, electroless plating or another process. In such embodiments, a seed layer (not shown) is formed over the barrier layer or over the spacers and conductive elements 110 by for example, atomic layer deposition. The seed layer provides nucleation sites for the plating process and increases the uniformity of the plated material that forms the vias 1102. In some embodiments, the conductive material of the vias 1102 extends over the via openings 702. Such overfilling is used, for example, to ensure that the openings 702 are completely filled. Excess material is removed by grinding, CMP, polishing, etching or another reduction process. After formation of the vias 1102, the top surfaces of the vias 1102 are substantially planar with the top surface of the etch stop layer 502. In some embodiments, the grinding process removes the etch stop layer 502 or reduces the top surface of the wafer substrate 112.

The vias 1102 extend through the wafer substrate 112 to contact one or more conductive elements 110. The spacers 1002 electrically insulate the vias 1102 from the wafer substrate 112 so that electrical signals sent through the vias 1102 do not interfere with active devices in the wafer substrate 112. In some embodiments, a via 1102 extends through the wafer substrate 112, the wafer RDL 114, and bond interface 202 to contact a conductive element 110 in the die RDL 108. In such an embodiment, the conductive element 110 on the die RDL 108 is electrically connected to the die substrate 106 through the die RDL 108. Thus, a connection between the die substrate 106 and an external device or connection may be formed from the wafer side of the package. Similarly, in some embodiments, a via 1102 extends through the wafer substrate 112 and contacts a conductive element 110 in the wafer RDL 114 that is electrically connected to the wafer substrate 112. Thus, power or data connections can be provided from the die 102 or wafer 104 through the wafer substrate 112 to an external device.

Additionally, in some embodiments, the wafer 104 can be electrically connected to the die 102 using the via last process. For example, a first conductive element 110 in the wafer RDL 114 and a second conductive element 110 in the die RDL 108 can be connected by a via 1102 that contacts both the first and second conductive elements 110. Thus, even though the RDLs 108 and 114 are between the die 102 and wafer 104, external electrical connectivity and die-to-wafer connectivity can be provided without discrete connectors such as microbumps or solder balls formed prior to bonding the die 102 to the wafer 104. Additionally, the via last process eliminates or relaxes the requirements for aligning the wafer to the die during the die-to-wafer bonding process.

It has been discovered that the spacers 1002 provide a lower cost and simpler structure for chip-on-wafer structures. Additionally, the spacers 1002 permit a height-to-width aspect ratio for the vias that is between 3 and about 10, increasing the density of inter-chip connections. It has been further discovered that, with the vias 1102 extending through the wafer substrate 112, the vias 1102 can be arranged through the package more regularly and provide a more heterogeneous chip stack. The regular arrangement of the vias 1102 also provides improved warpage control during subsequent processing or package mounting.

Figure 12:
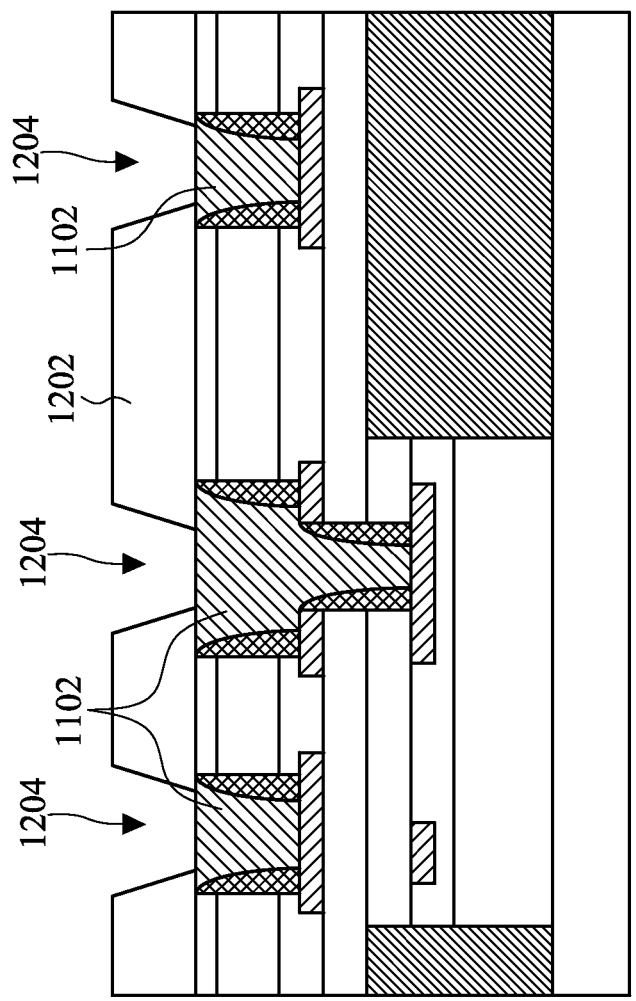

FIG. 12 is a cross-sectional view illustrating a top RDL insulating layer 1202. In some embodiments, an insulating material such as PBO, silicon oxide, polyimide, or another insulating material is formed over the etch stop layer 502. One or more RDL openings 1204 are formed in the insulating layer 1202 exposing the vias 1102. In some embodiment, insulating layer 1202 is PBO that is sprayed on or spun on, and the RDL openings 1204 are formed by exposing and developing the PBO with a photolithographic process. In other embodiments, the insulating layer 1202 is deposited by CVD or the like and etched, laser drilled, milled, or otherwise patterned.

Figure 13:
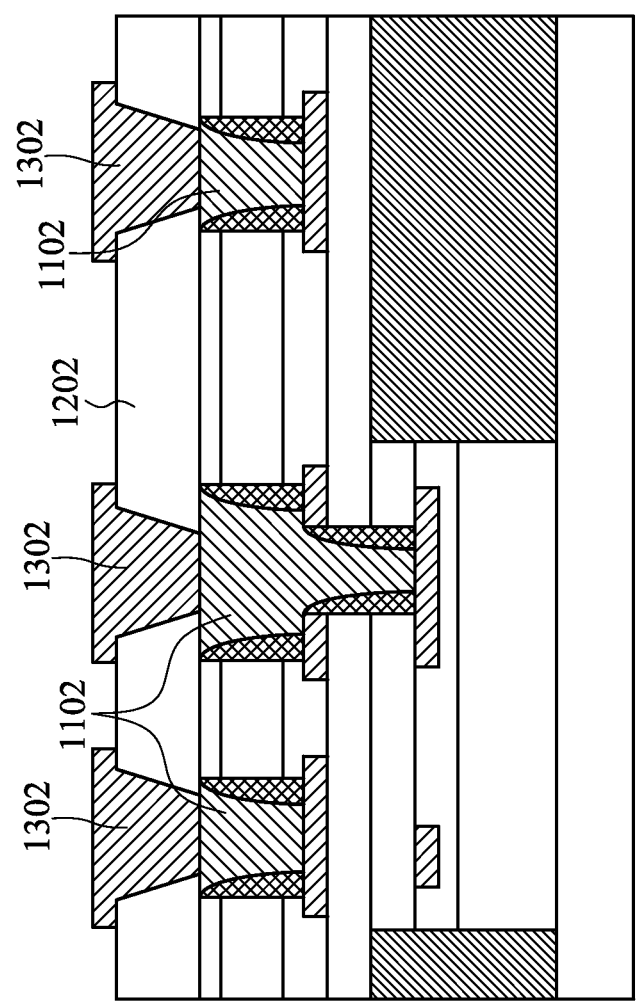

FIG. 13 is a cross-sectional view illustrating formation of top RDL conductive elements 1302 in the top RDL insulating layer 1202 according to an embodiment. A conductive material, such as copper, is deposited over the insulating layer 1202 in the RDL openings 1204 through, for example, sputtering, PVD, CVD, plating or another deposition process. The deposited conductive material is patterned by masking and etching or by masking prior to deposition. While the illustrated top RDL conductive elements 1302 are shown extending substantially vertically for clarity, it should be understood that in some embodiments, the top RDL conductive elements 1302 have portions that extend laterally to provide a desired layout for subsequently formed layers or connectors.

Figure 14:
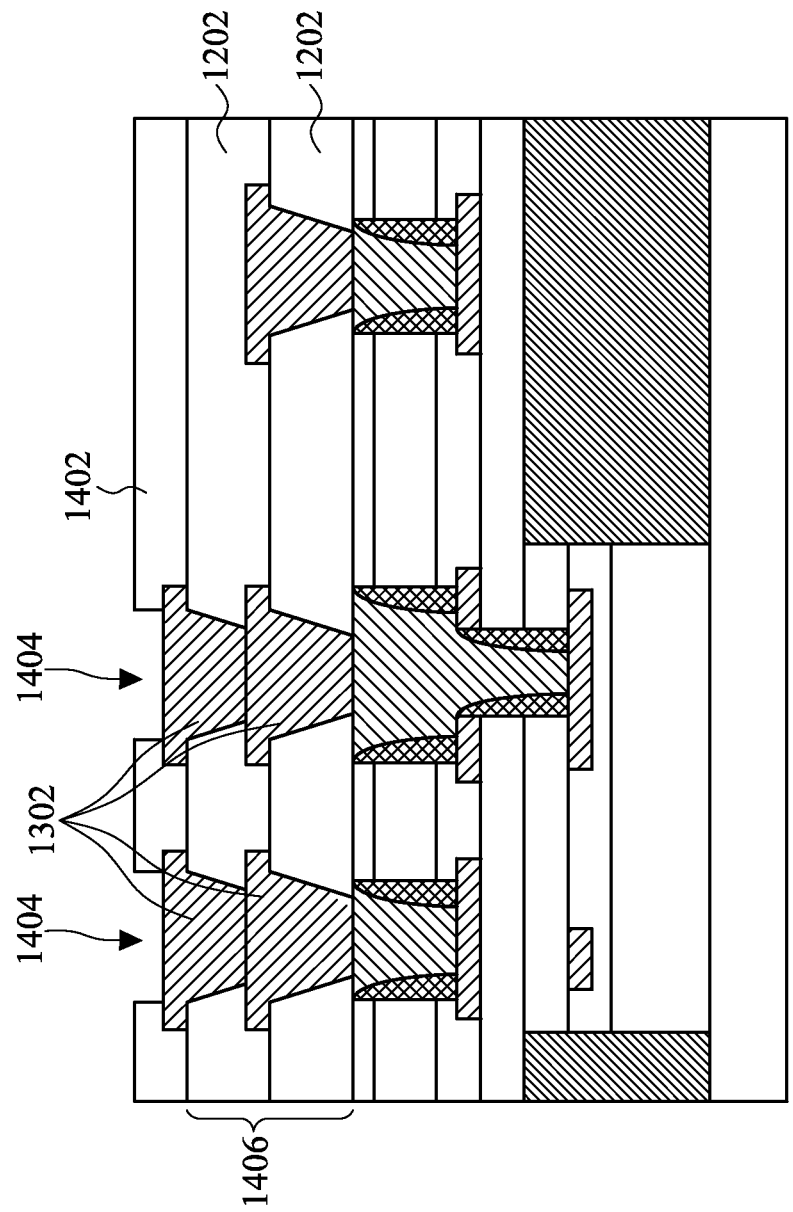

FIG. 14 is a cross-sectional view illustrating formation of additional insulating layers and conductive elements to form the top RDL 1406. One or more top RDL insulating layers 1202 with conductive elements 1302 are formed in a stack to provide electrical connectivity between external devices and the vias 1102. Additionally, a protective layer 1402 is formed over the uppermost top RDL insulating layer 1202 and has openings exposing the top RDL conductive elements 1302. In some embodiments, the protective layer 1402 is PBO, an epoxy, an oxide, a nitride, a carbide, an oxynitride, a polyimide, or another insulating or protective material and is deposited and patterned as described above.

Figure 15:
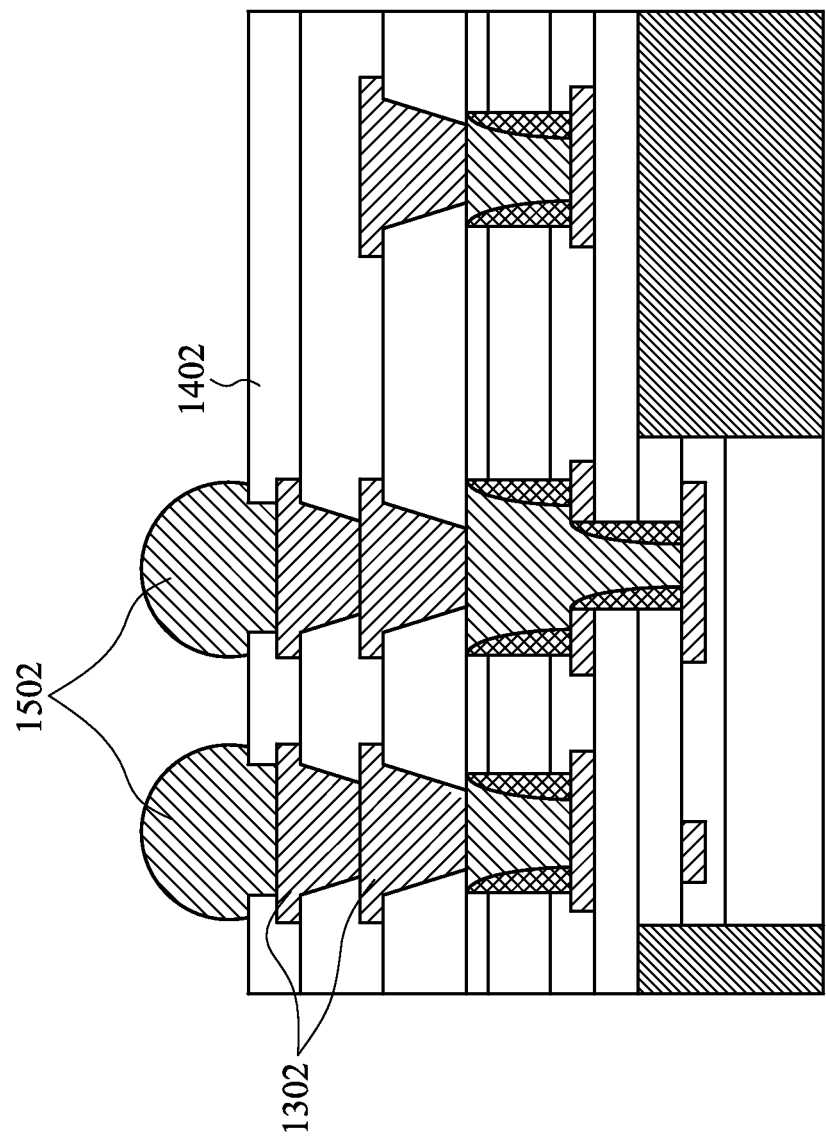

FIG. 15 is a cross-sectional view illustrating formation of connectors 1502 according to an embodiment. One or more connectors 1502 are mounted on exposed portions of the top RDL conductive elements 1302. In some embodiments, the connectors 1502 are solder balls, pillars, conductive bumps or another conductive connector. The connectors 1502 are configured to permit mounting of the package to a target substrate such as a die, package, wafer, PCB or the like. Thus, the wafer 104 and die 102 would be in signal connectivity with the target substrate through the connectors 1502 and vias 1102. The carrier 402 then removed from the package.

While the chip-on-wafer package is shown using the via last process to form vias 1102 that extend from the wafer side of the package through the wafer substrate 112 to the RDLs 108 and 114, it should be understood that the disclosed embodiments are not limited to such an arrangement. In other embodiments, vias 1102 are formed from the die side of the package through the die substrate 106 and isolation material 302 to the RDLs 108 and 114. Additionally, in some embodiments, the vias 1102 are formed from both the wafer side and die side of the package.

Additionally, the embodiments disclosed above are not limited to the order of steps and structure described above. FIGS. 16 through 20 illustrate cross-sectional views of intermediate processing steps in forming a chip-on-wafer structure having partial height self-aligning spacers according to an embodiment.

Figure 16:
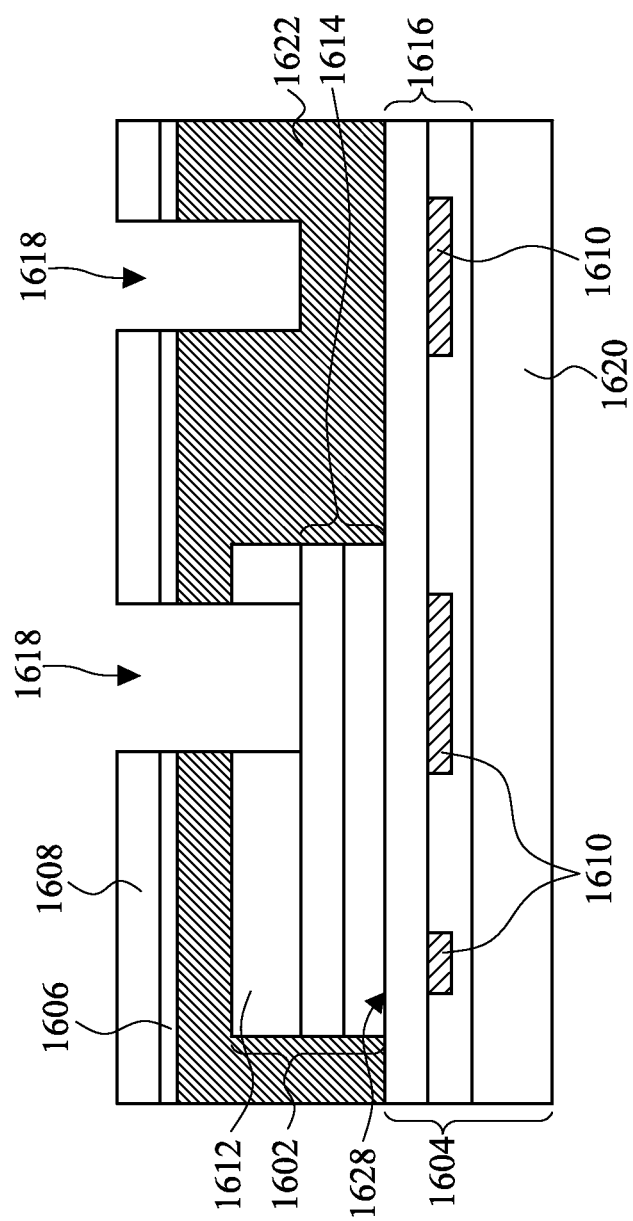
FIGS. 16-20 illustrate cross-sectional views of intermediate processing steps in forming a chip-on-wafer structure using via last process according to another embodiment.

FIG. 16 illustrates a cross-sectional view of masking and etching via openings 1618 in an isolation material 1622 of a package according to an embodiment. A die 1602 and wafer 1604 are bonded, for example, as described above. The die 1602 and wafer 1604 have a die substrate 1612 and wafer substrate 1620, respectively, and the substrates 1612 and 1620 have one or more active devices. A die RDL 1614 and wafer RDL 1616 are disposed on the respective substrates 1612 and 1620 and comprise dielectric layers with conductive elements 1610 disposed therein, some of which are in contact with the active devices in the respective substrates 1612 and 1620. The die 1602 and wafer 1604 are bonded together so that the die RDL 1614 and wafer RDL 1616 are in contact and form a bond interface 1628. In some embodiments, the die 1602 and wafer 1604 are bonded with a direct surface, metal-to-metal or hybrid bond as described above. The isolation material 1622 is formed over the die 1602, and in some embodiments, extends over the die 1602. An etch stop layer 1606 is formed over the isolation material 1622.

A mask 1608 is deposited over the etch stop layer 1606 and patterned with openings disposed over one or more of the conductive elements 1610. Via openings 1618 are etched through the isolation material 1622 using the mask 1608 to control the location of the via openings 1618. In an embodiment, the via openings 1618 extend through the isolation material 1622, and via openings 1618 disposed over the die substrate 1612 extend through the die substrate 1612 to the die RDL 1614. The via openings 1618 that are adjacent to, and not disposed over, the die substrate 1612 extend partially through the isolation material 1622.

Figure 17:
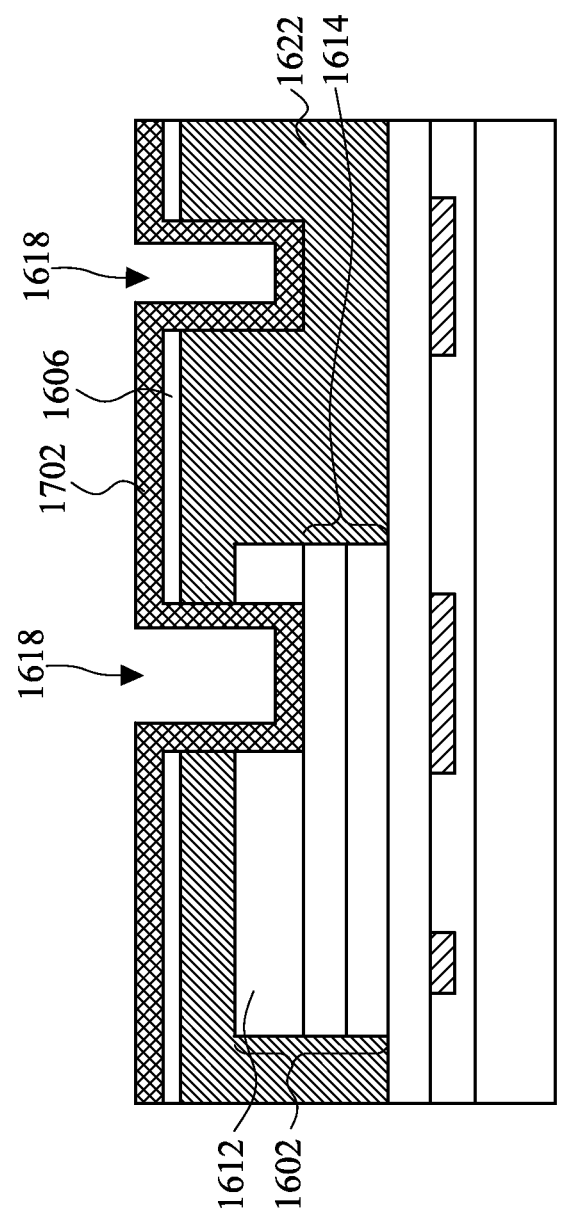

FIG. 17 is a cross-sectional view illustrating formation of an isolation layer 1702 according to an embodiment. The mask 1608 (see FIG. 16) is removed, and a conformal dielectric isolation layer 1702 is formed over the etch stop layer 1606. In an embodiment, the isolation layer 1702 is formed as described above. The isolation layer 1702 extends into each of the via openings 1618 and covers the sidewalls of the via openings 1618, including the portions of the die substrate 1612 exposed in the via openings 1618. Additionally, the isolation layer 1702 covers the lateral surfaces of, for example, the die RDL 1614 and the isolation material 1622 that are exposed at the bottoms of the openings 1618.

Figure 18:
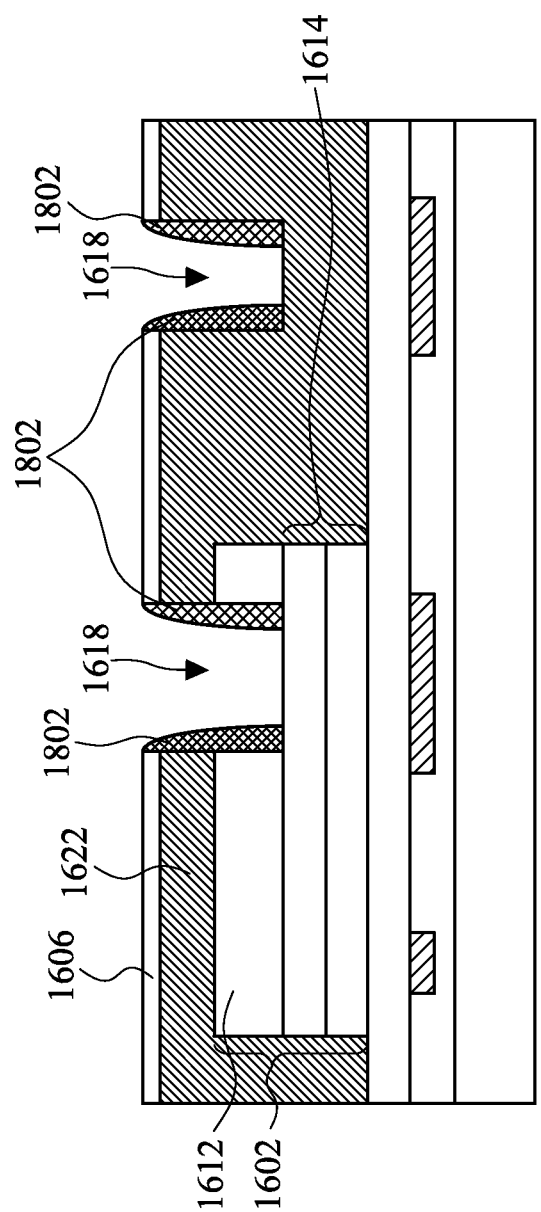

FIG. 18 is a cross-sectional view illustrating formation of partial height self-aligning spacers 1802 according to an embodiment. The isolation layer 1702 (see FIG. 17) is etched, in some embodiments, as described above. The etch exposes portions of the lateral surfaces of the die RDL 1614 in the via openings 1618 between the spacers 1802. Additionally, for the via openings 1618 that are adjacent to, and not disposed over, the die RDL 1616, the etch exposes the isolation material 1622 surface that forms the bottom of the via openings 1618.

Figure 19:
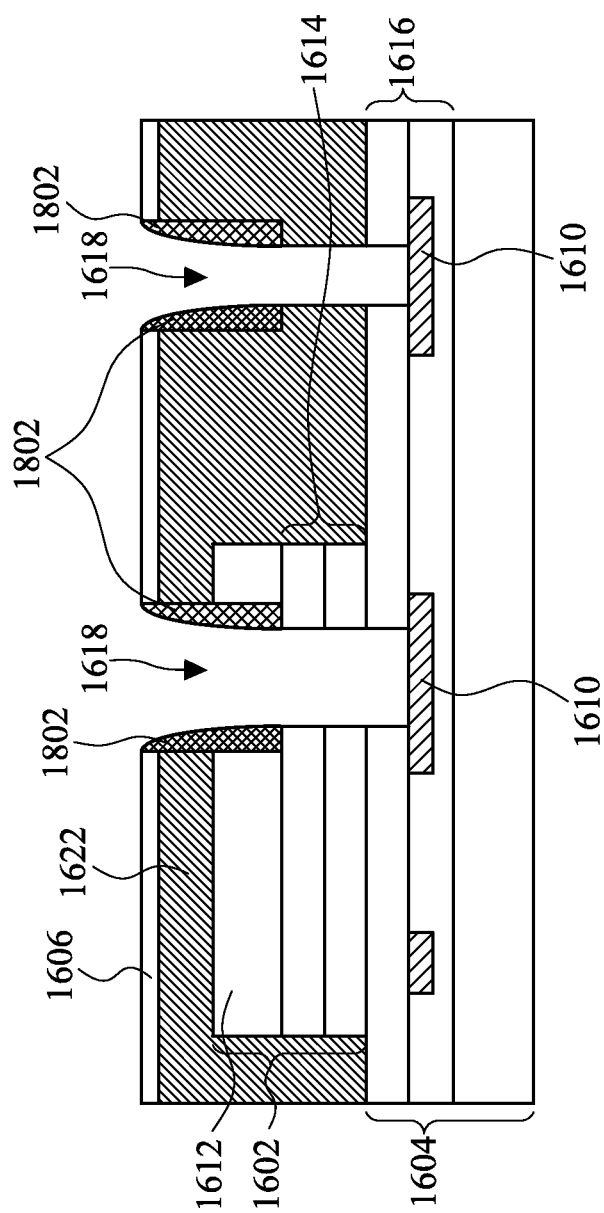

FIG. 19 illustrates a cross-sectional view of a second etch after formation of the spacers 1802 according to an embodiment. In some embodiments, the isolation layer 1702 is selectively etched as described above with respect to FIG. 8. The via openings 1618 are extended to underlying conductive elements 1610 in the RDLs 1614 and 1616, exposing an upper surface of the conductive elements 1610. In such an embodiment, the spacers 1802 extend only partially through the via openings 1618, with bottom surfaces of the spacers 1802 disposed on the die RDL 1614 or within the isolation material 1622. However, the spacers 1802 are disposed in the via openings 1618 on the sidewalls of the die substrate 1612, electrically insulating the die substrate 1612 from the via openings 1618 and subsequently formed vias. It has been discovered that the partial height self-aligning spacers 1802 permit etching of both the die RDL and the RDLs 1614 and 1616 with a single mask. The spacers 1802 mask the sidewalls of the die RDL 1614 during the second etch. The resulting via openings 1618 have a lower portion with sidewalls that are substantially planar, level, even or aligned with the inner surfaces of the spacers 1802. In some embodiments where the isolation material 1622 extends over the top surface of the die substrate 1012, the spacers 1802 extend from about the bottom surface of the die substrate 1612 to, or above, the top surface of the isolation material 1622.

Figure 20:
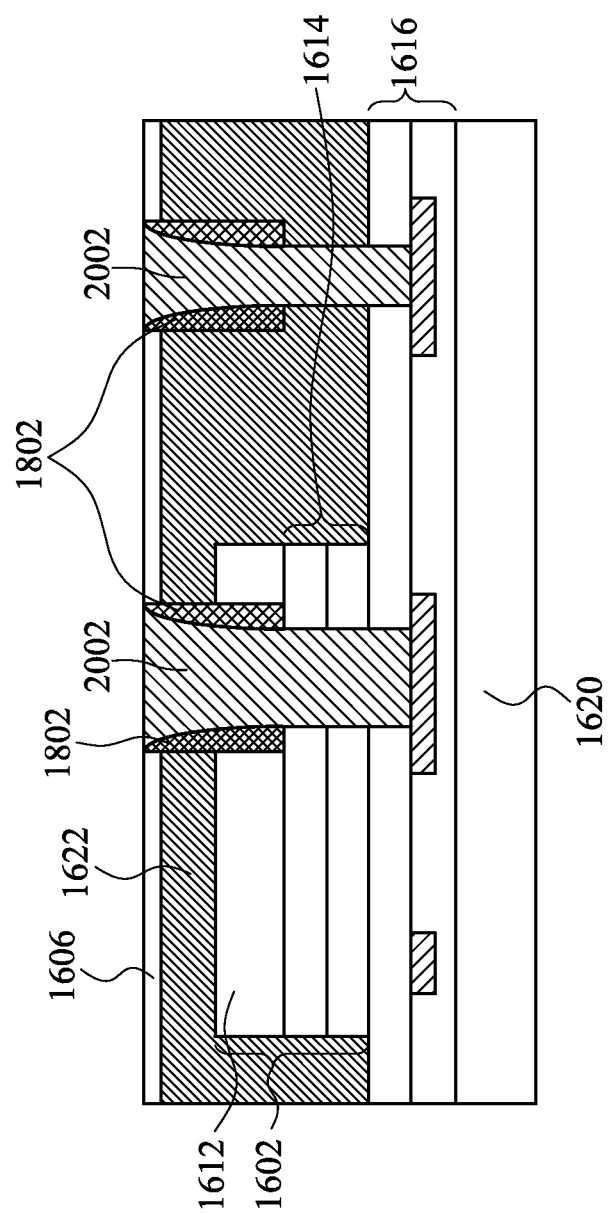

FIG. 20 illustrates a cross-sectional view of formation of the vias 2002 according to an embodiment. In some embodiments, vias 2002 are formed in the via openings 1618 (see FIG. 17) as describe above with respect to FIG. 11. The vias 2002 are insulated from the die substrate 1612 by the spacers 1802, and extend from the top surface of the package through the die substrate 1612 to conductive elements 1610 in the RDLs 1614 and 1616.

While the described embodiments is illustrated as having a partial height spacer 1802 insulating the vias 2002 from the die substrate 1612, the embodiments are not limited to those described. For example, in some embodiments, the partial height spacers 1802 are disposed in the wafer substrate 1620, with the vias 2002 extending to the RDLs 1614 and 1616 from the wafer side of the package.

Figure 21:
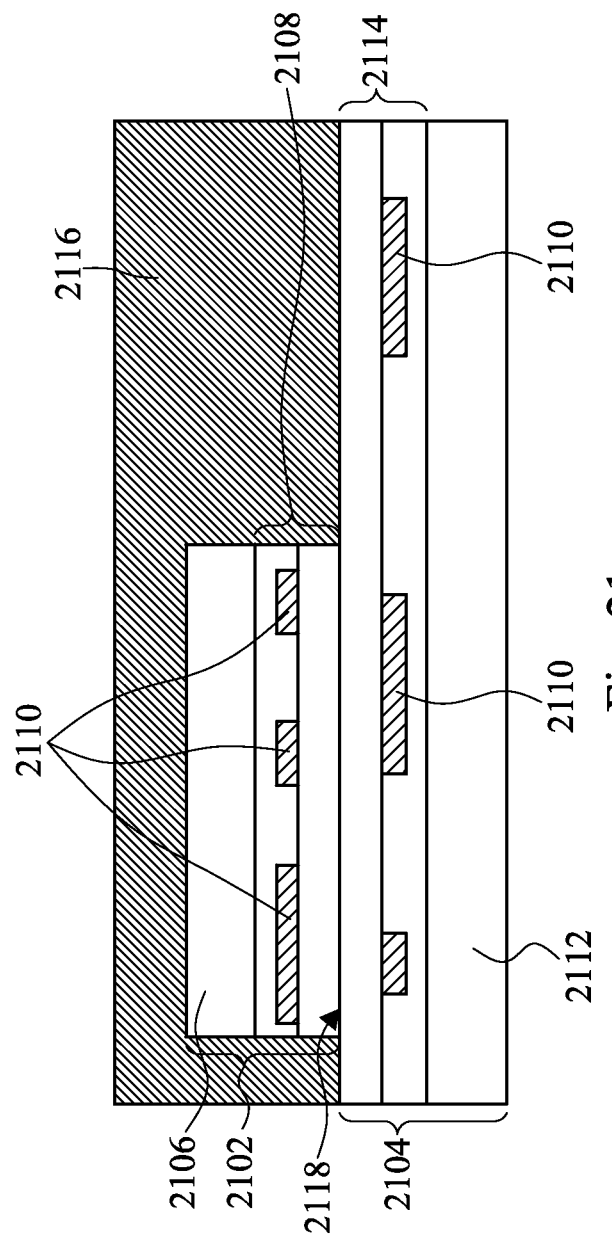
FIGS. 21-29 illustrate cross-sectional views of intermediate processing steps in forming a chip-on-wafer structure using a dual damascene via last process according to an embodiment.

FIGS. 21 through 29 illustrate cross-sectional views of intermediate processing steps in forming a chip-on-wafer structure using a dual damascene via last process according to an embodiment. FIG. 21 illustrates a cross-sectional view of formation of an isolation material 2116 over a die 2102 bonded to a wafer 2104 according to an embodiment. The die 2102 and wafer 2104 have, respectively, a die substrate 2106 and wafer substrate 2112 having one or more active devices. A die RDL 2108 and wafer RDL 2114 are disposed on the respective substrates 2106 and 2112 and comprise dielectric layers with conductive elements 2110 disposed therein, some of which are in contact with the active devices in the respective substrates 2106 and 2112. The die 2102 and wafer 2104 are bonded as described above so that the die RDL 2108 and wafer RDL 2114 are in contact and form a bond interface 2118. The isolation material 2116 is formed over the die 2102 and wafer 2104 as described above, and in some embodiments, extends over the die 2102.

Figure 22:
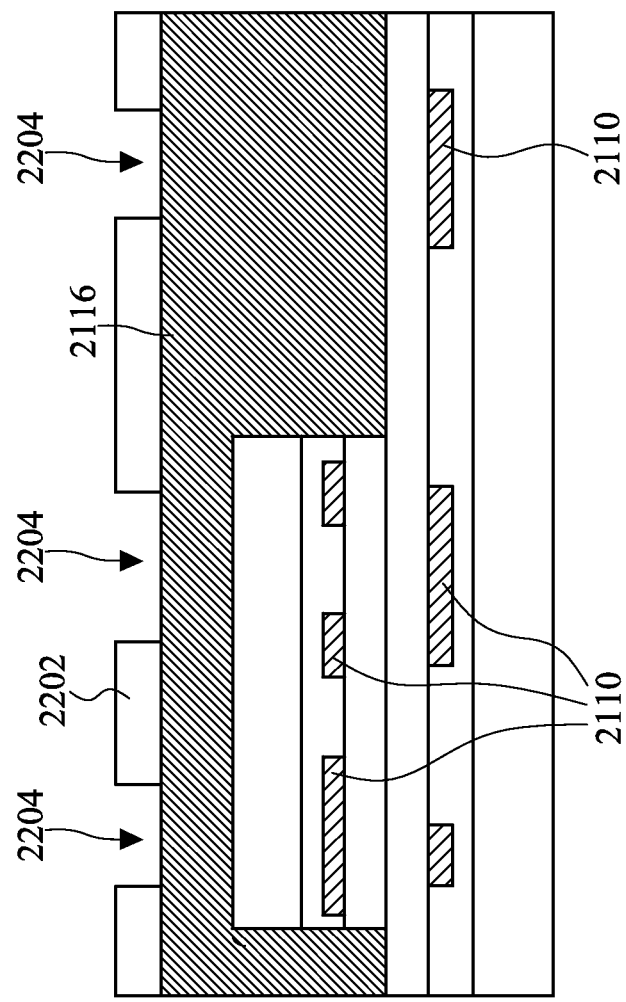

FIG. 22 illustrates a cross-sectional view of forming a first mask 2202 on the package according to an embodiment. In such an embodiment, the first mask 2202 is formed over the isolation material 2116 and is patterned to form openings 2204. The first mask 2202 is, in some embodiments, a photoresist that is deposited, exposed and developed. The openings 2204 in the first mask 2202 are aligned over conductive elements 2110 in the RDLs 2108 and 2114. It has been discovered that a dual damascene technique for forming via openings permits the elimination of an etch stop layer and associated etch of the etch stop layer. In such an embodiment, the first mask 2202 is disposed on the isolation material 2116.

Figure 23:
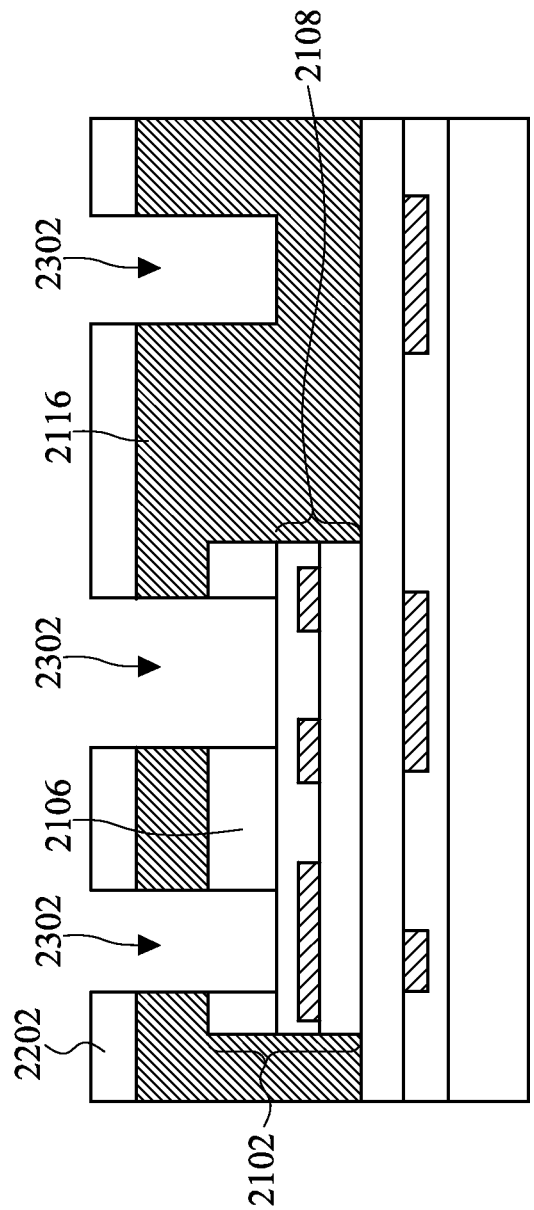

FIG. 23 illustrates a cross-sectional view of etching the die substrate 2106 according to an embodiment. Via openings 2302 are formed through the isolation material 2116, and through the die substrate 2106 to expose the die RDL 2108. In an embodiment, the via openings 2302 are etched as described above. Via openings 2302 that are adjacent to, and not disposed over, the die substrate 2106 extend partially through the isolation material 2116.

Figure 24:
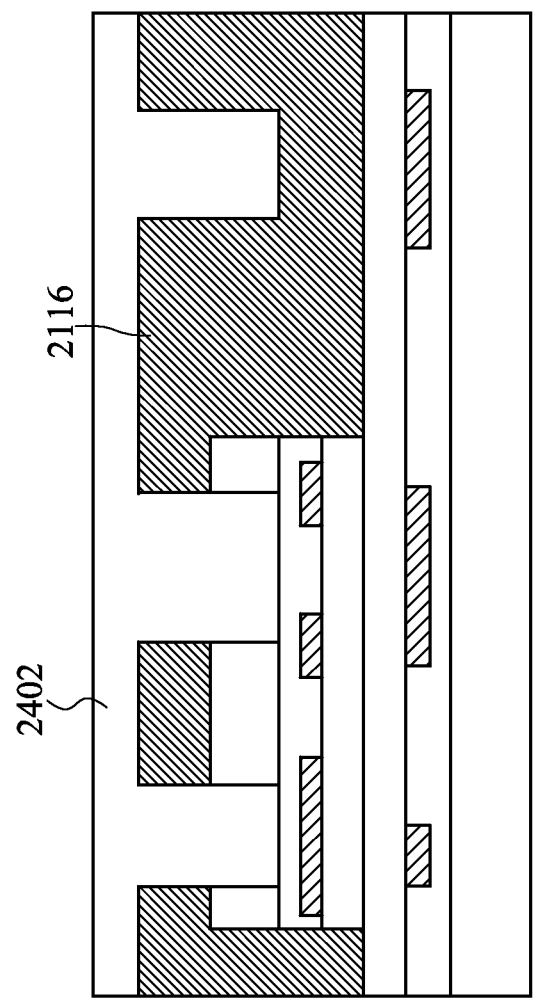

FIG. 24 illustrates a cross-sectional view of application of a second mask 2402 according to an embodiment. In some embodiments, after the first etch of the via openings 2302 through the die substrate 2106, the first mask 2202 is removed. A second mask 2402 is formed over the substrate extends into the via openings 2302. In some embodiments, the second mask 2402 is a photoresist deposited, by for example, spin coating, spray coating, or the like.

Figure 25:
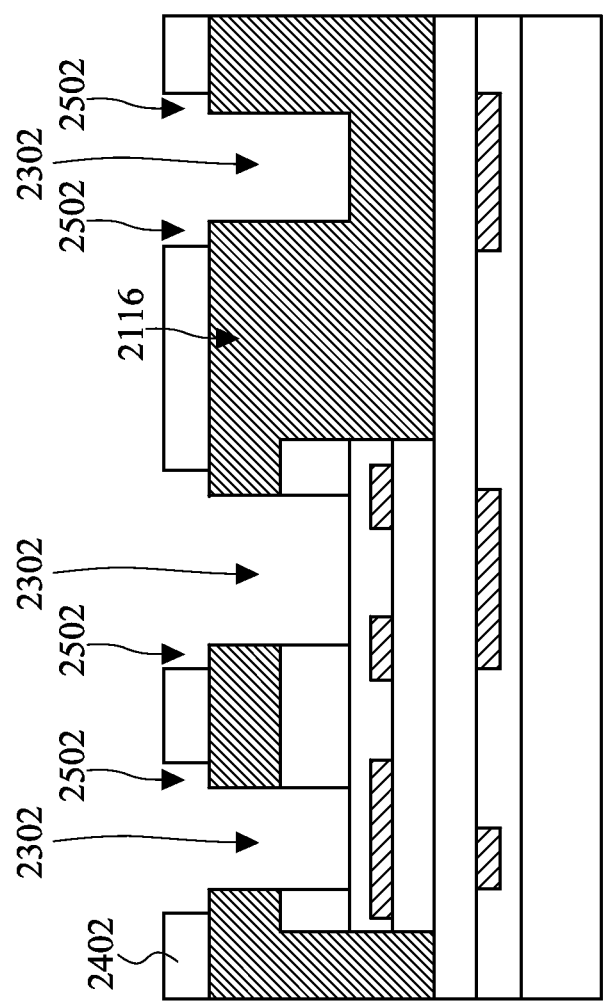

FIG. 25 illustrates a cross-sectional view of patterning the second mask 2402 according to an embodiment. In some embodiments, the second mask 2402 is exposed and developed to pattern the second mask 2402 with second mask openings 2502. In some embodiments, the second mask openings 2502 are wider than the via openings 2302 after the first etch, with the second mask openings 2502 disposed over the via openings 2302. Additionally, in some embodiments, the second mask openings 2502 define openings for metal lines that extend laterally from the via openings to provide electrical connectivity to vias subsequently formed in lower portions of the via openings 2302.

Figure 26:
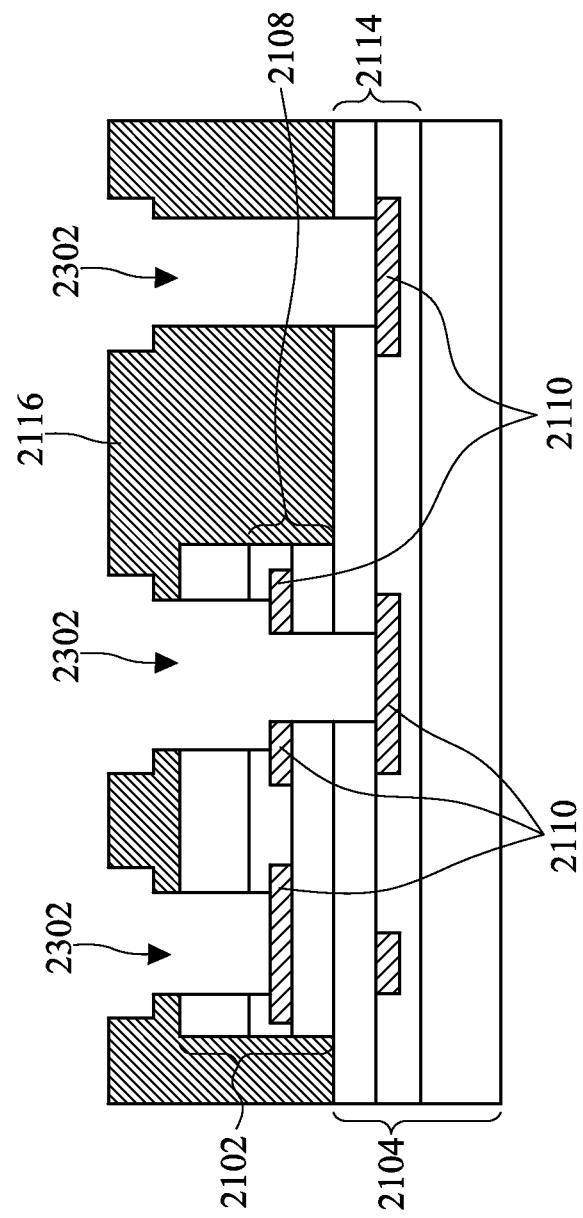

FIG. 26 illustrates a cross-sectional view of etching the RDLs 2108 and 2114 according to an embodiment. The RDLs 2108 and 2114 are etched and the second mask 2402 is removed. In some embodiments, a time mode etch process is used so that the etching process etches a predetermined depth. Etching with the second mask results in upper portions of the via openings 2302 having a width wider than the lower portions of the via openings 2302. The time mode etch controls the depth of the upper portions of the via openings 2302, and results in the lower portions of the via openings 2302 being extended downward to expose the underlying conductive elements 2110.

Figure 27:
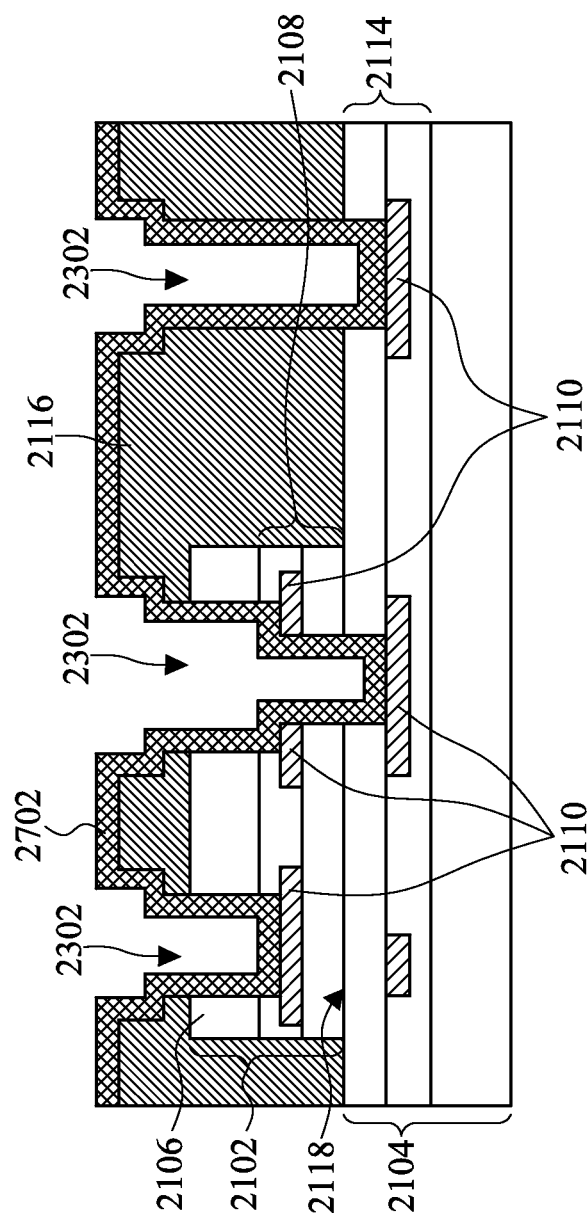

FIG. 27 is a cross-sectional view illustrating formation of an isolation layer 2702 according to an embodiment. A conformal dielectric isolation layer 2702 is formed over the isolation material 2116 and extends into the via openings 2302. In an embodiment, the isolation layer 2702 is formed as described above. The isolation layer 2702 extends into each of the via openings 2308 and covers the sidewalls of the via openings 2308, including the portions of the die substrate 2106 exposed in the via openings 2302.

Figure 28:
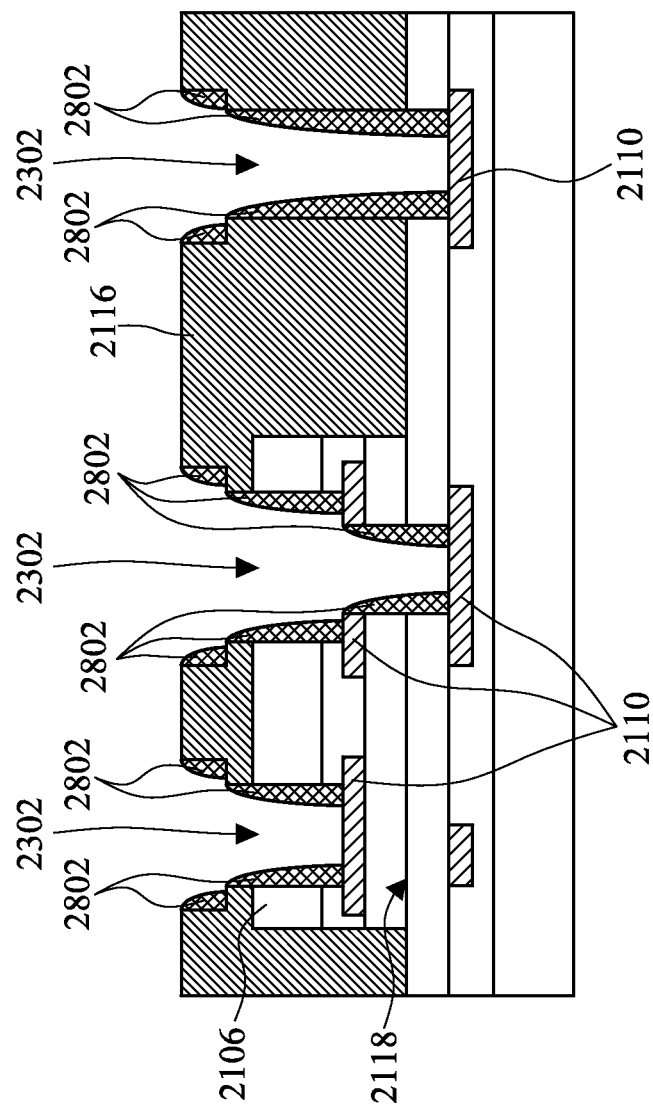

FIG. 28 is a cross-sectional view illustrating formation of self-aligning spacers 2802 according to an embodiment. In some embodiments, the isolation layer 2702 (see FIG. 27) is etched as described above, removing the lateral portions of the isolation layer 2702 and leaving the spacers 2802 on the sidewalls of the via openings 2302. The spacers 2802 insulate the die substrate 2106 from the via openings 2302 and expose portions of the top surfaces of the conductive elements 2110. In some dual damascene embodiments, separate spacers 2802 are formed in the upper and lower portions of the via openings 2302, with the upper and lower spacers 2802 laterally separated from each other and exposing a lateral surface of the isolation material 2116. Additionally, the lower spacers 2802 extend from conductive elements 2110 in the RDLs 2108 and 2114 above the die substrate 2106 into the isolation material 2116.

Figure 29:
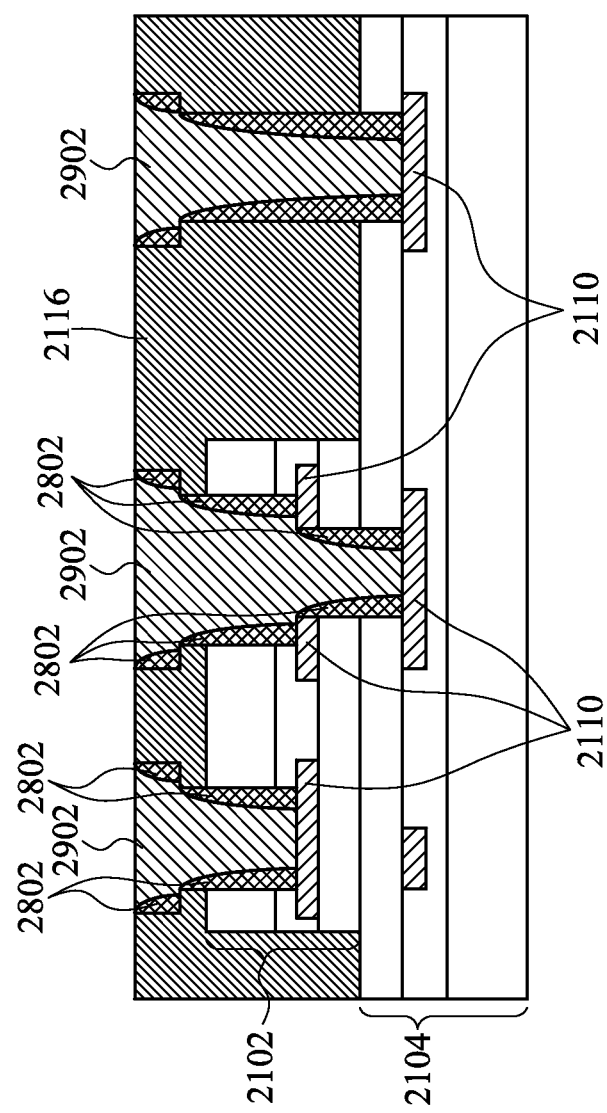

FIG. 29 is a cross-sectional view illustrating formation of vias 2902 in the via openings 702 according to an embodiment. In some embodiments, the vias 2902 are formed as described above. The vias 2902 are insulated from the die substrate 2106 by the spacers 2802 and extend from the top surface of the isolation material 2116 to the conductive elements 2110. In some embodiments, the top portions of the vias 2902 extend laterally through the top portion of the isolation material 2116, forming a first layer for a top RDL in the isolation material 2116. Forming the spacers 2802 after the second etch permits the spacers to be formed full height within the via openings 2302. In some embodiments, a barrier layer, seed layer and metal layer are formed in the via openings 2302, and then reduced by CMP or the like. Thus, discrete steps form forming the conductive elements of the first layer of the top RDL can be consolidated into the via formation process, reducing costs and increasing throughput.

Figure 30:
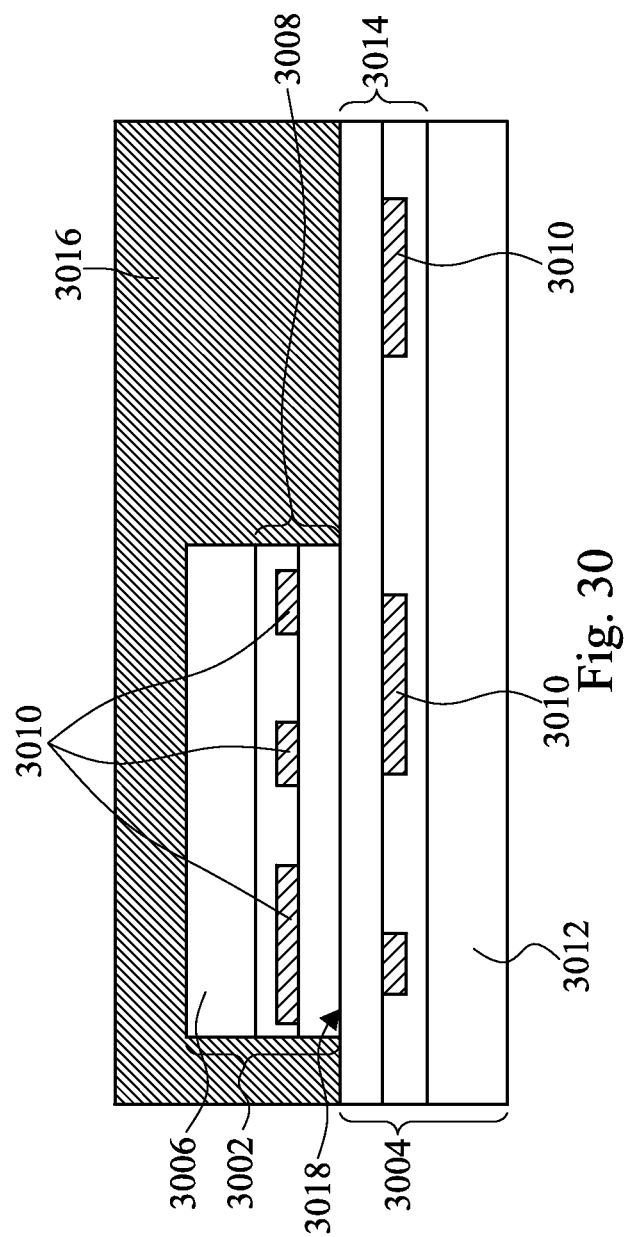
FIGS. 30-39 illustrate cross-sectional views of intermediate processing steps in forming a chip-on-wafer structure using a dual damascene via last process according to an alternative embodiment.

FIGS. 30 through 37 illustrate cross-sectional views of intermediate processing steps in forming a chip-on-wafer structure using a dual damascene via last process according to an alternative embodiment. FIG. 30 illustrates a cross-sectional view of formation of a first isolation material 3016 over a die 3002 bonded to a wafer 3004 according to an embodiment. The die 3002 and wafer 3004 have, respectively, a die substrate 3006 and wafer substrate 3012 having one or more active devices. A die RDL 3008 and wafer RDL 3014 are disposed on the respective substrates 3006 and 3012 and comprise dielectric layers with conductive elements 3010 disposed therein, some of which are in contact with the active devices in the respective substrates 3006 and 3012. The die 3002 and wafer 33004 are bonded as described above so that the die RDL 3008 and wafer RDL 3014 are in contact and form a bond interface 3018. The isolation material 3016 is formed over the die 3002 and wafer 3004 as described above, and in some embodiments, extends over the die 3002.

Figure 31:
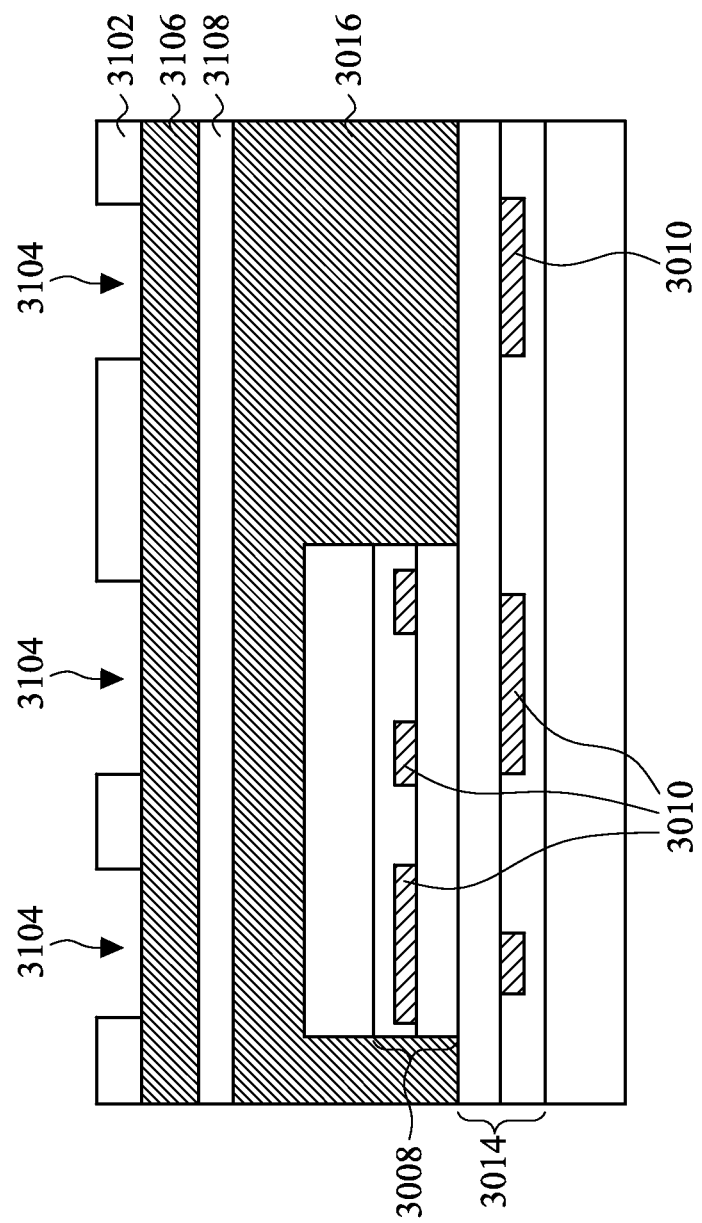

FIG. 31 illustrates a cross-sectional view of forming an etch stop layer 3108, a second isolation material 3106, and a first mask 3102 on the package according to an embodiment. In such an embodiment, etch stop layer 3108 (e.g., a silicon nitride layer) may be deposited over the first isolation material 3016, and a second isolation material 3106 (e.g., a dielectric layer, insulating film, molding compound, and the like) may be deposited over etch stop layer 3108. The formation of etch stop layer 3108 and isolation material 3106 may include CVD, PECVD, molding, and/or planarization processes, for example.

Furthermore, a first mask 3102 is formed over the isolation material 3106 and is patterned to form openings 3104. The first mask 3102 is, in some embodiments, a photoresist that is deposited, exposed and developed. The openings 3104 in the first mask 3102 are aligned over conductive elements 3010 in the RDLs 3008 and 3014. In other embodiments, the first mask 3102 is a hard mask, which patterned using a combination of photolithography and etching, for example.

Figure 32:
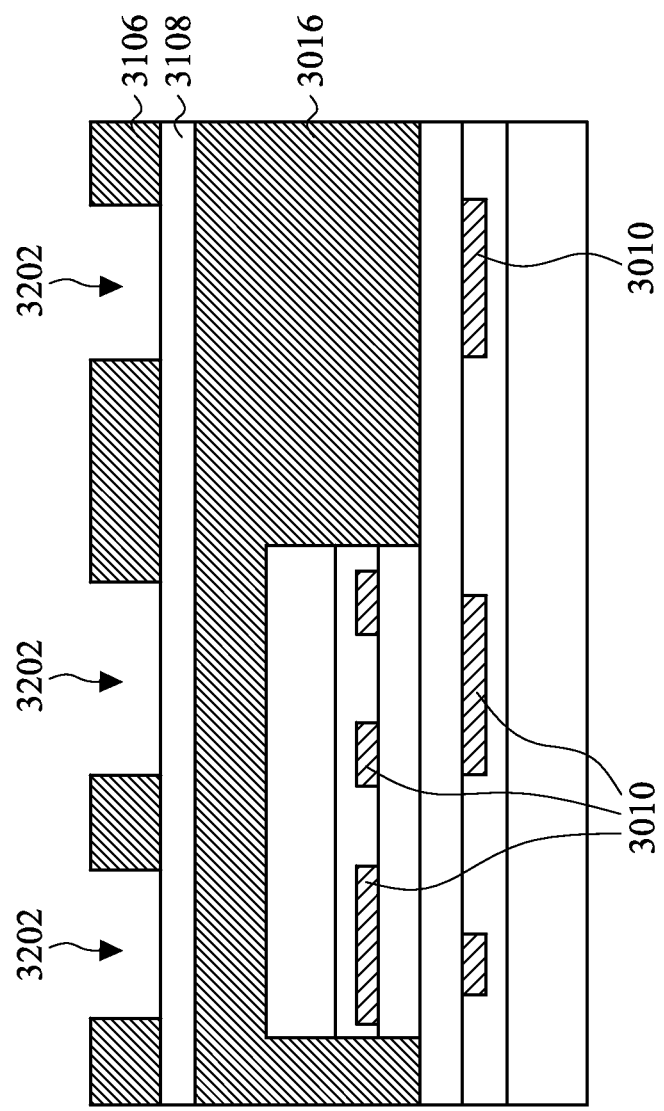

FIG. 32 illustrates a cross-sectional view of etching isolation material 3106 according to an embodiment. Via openings 3202 are formed through the isolation material 3106. In an embodiment, the via openings 3202 are etched as described above. Etch stop layer 3108 may prevent the patterning of underlying isolation material 3016 during the patterning of isolation material 3106. After the etching of isolation material 3106, first mask 3102 may be removed.

Figure 33:
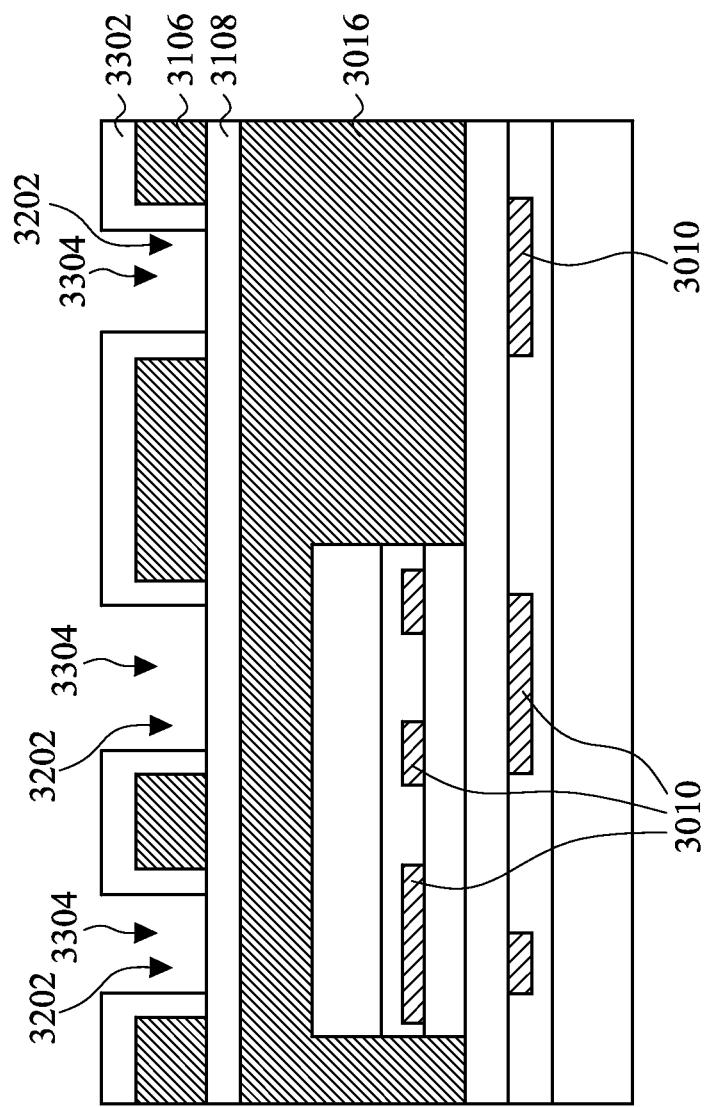

FIG. 33 illustrates a cross-sectional view of application of a second mask 3302 according to an embodiment. Second mask 3302 is formed over isolation material 3106 and extends into the via openings 3202. In some embodiments, the second mask 3302 is a photoresist deposited, by for example, spin coating, spray coating, or the like.

As further illustrated by FIG. 33, the second mask 3302 is patterned according to an embodiment. In some embodiments, the second mask 3302 is exposed and developed to pattern the second mask 3302 with second mask openings 3304. Second mask openings 3304 may extend through via openings 3202 and further mask off portions of via openings 3202. In some embodiments, the second mask openings 3304 are narrower than the via openings 3202 after the first etch, with the second mask openings 3304 overlapping portions of via openings 3202. In other embodiments, the second mask 3302 may be a hard mask material, which may be blanket deposited and patterned as described above.

Figure 34:
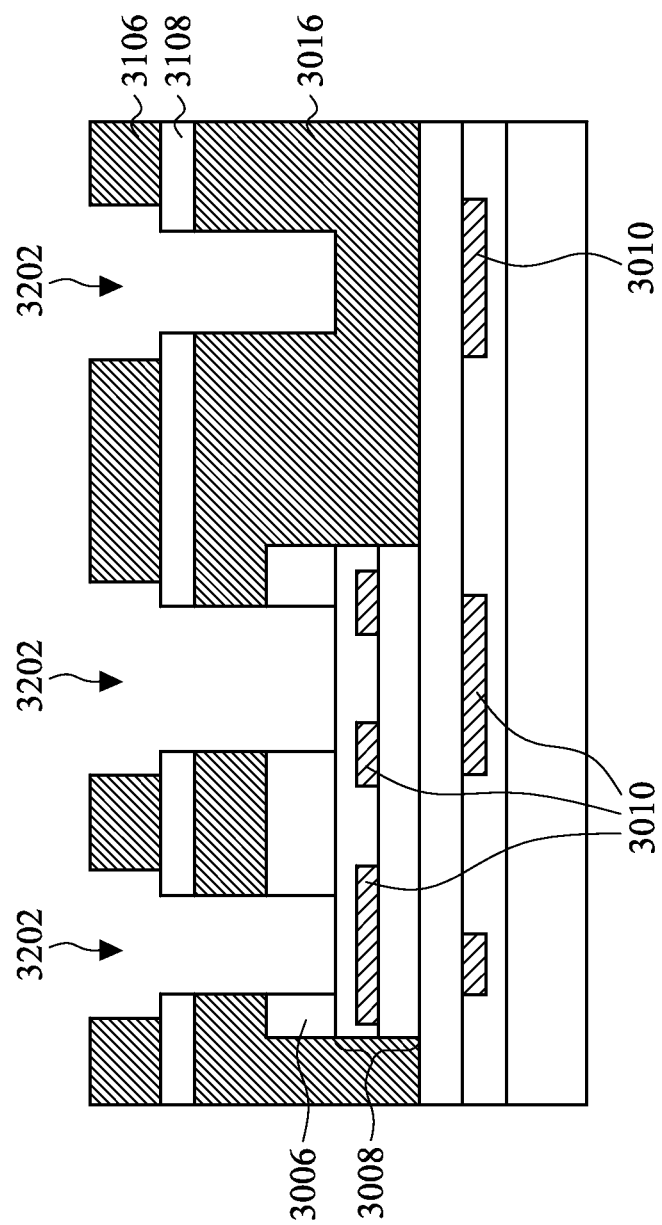

FIG. 34 illustrates a cross-sectional view of etching the etch stop layer 3108, isolation material 3015, and die substrate 3006 according to an embodiment. Via openings 3202 are formed through the isolation material 3016, and through the die substrate 3006 to expose the die RDL 3008. In an embodiment, the via openings 3202 are etched as described above. The etching process may include first removing portions of etch stop layer 3108 exposed by second mask openings 3304 (see FIG. 33) and subsequently etching isolation material 3016 and die substrate 3006. Via openings 3202 that are adjacent to, and not disposed over, the die substrate 3006 extend partially through the isolation material 3016. In some embodiments, a time mode etch process is used so that the etching process etches a predetermined depth. After etching, the second mask 3302 may be removed. After etching, via openings 3202 include a wider portion disposed over a narrower portion. In such embodiments, the wider portions of via openings 3202 are disposed in isolation material 3106. The wider portions of via openings 3202 define openings for metal lines that extend laterally from the via openings to provide electrical connectivity to vias subsequently formed in narrower portions of the via openings 3202.

Figure 35:
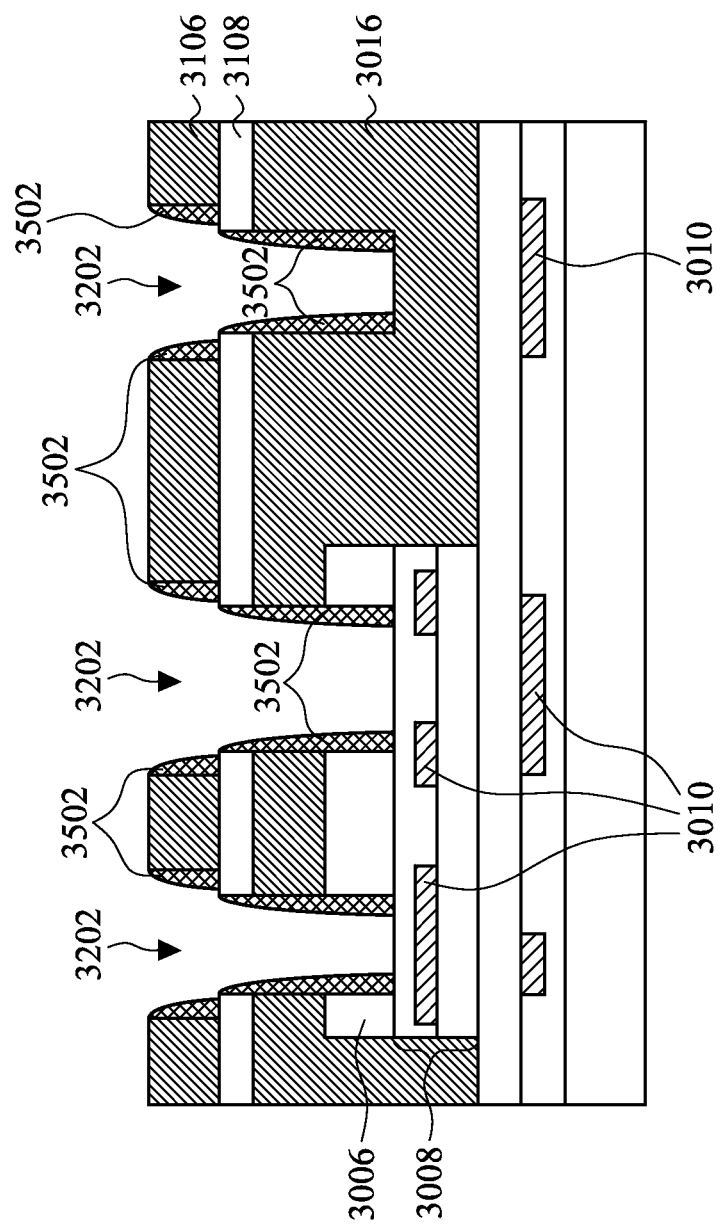

FIG. 35 is a cross-sectional view illustrating formation of partial height self-aligning spacers 3502 according to an embodiment. The formation of self-aligning spacers 3502 may include first forming a conformal dielectric isolation layer (not shown) over the isolation material 3106, extends into the via openings 3202, and covers the sidewalls of the via openings 3202 (including the portions of the die substrate 3006 exposed in the via openings 3202). Subsequently, the conformal dielectric isolation layer is etched as described above, removing the lateral portions of the conformal dielectric isolation layer and leaving the spacers 3502 on the sidewalls of the via openings 3202. The spacers 3502 insulate the die substrate 3006 from the via openings 3202. In some dual damascene embodiments, separate spacers 3502 are formed in the upper and lower portions of the via openings 3202, with the upper and lower spacers 3502 laterally separated from each other and exposing a lateral surface of the etch stop layer 3108.

Figure 36:
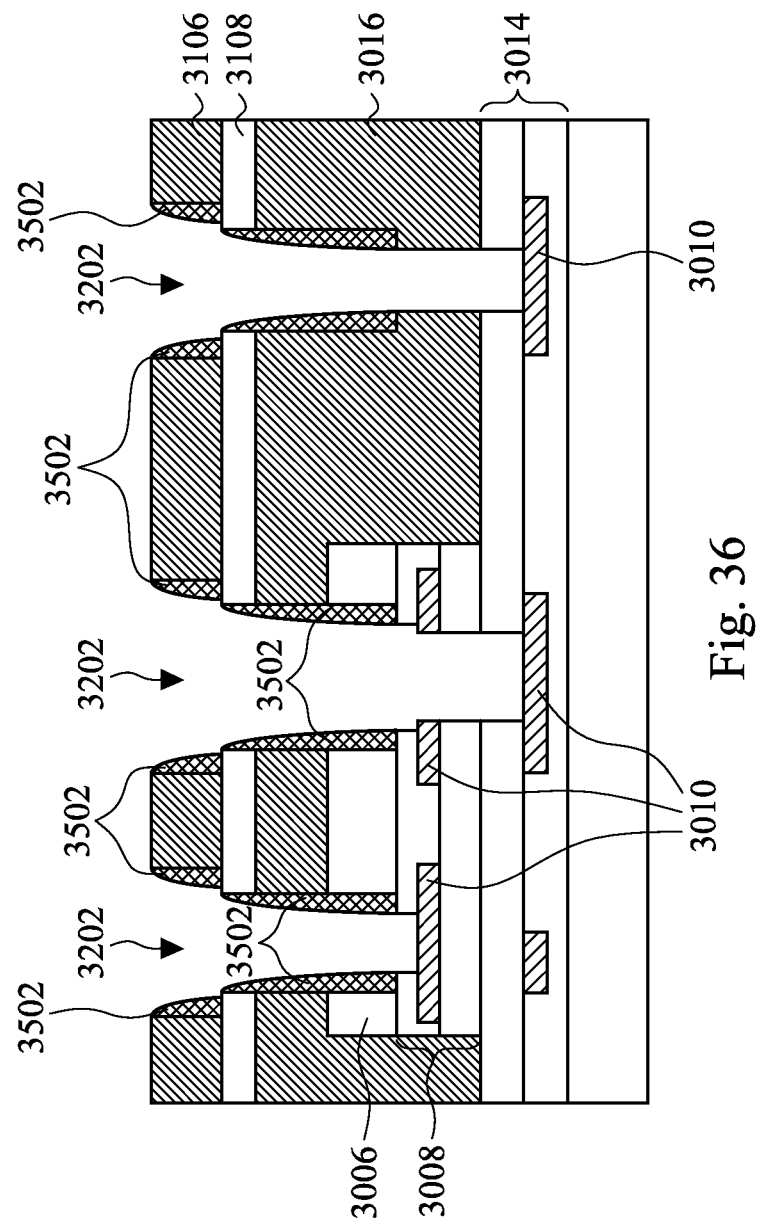

FIG. 36 illustrates a cross-sectional view of a second etch after formation of the spacers 3502 according to an embodiment. The via openings 3202 are extended to underlying conductive elements 3010 in the RDLs 3008 and 3014, exposing an upper surface of the conductive elements 3010. In such an embodiment, the spacers 3502 extend only partially through the via openings 3202, with bottom surfaces of the spacers 3502 disposed on the die RDL 3008 or within the isolation material 3016. However, the spacers 3502 are disposed in the via openings 3202 on the sidewalls of the die substrate 3006, electrically insulating the die substrate 3006 from the via openings 3202 and subsequently formed vias.

The partial height self-aligning spacers 3502 permit etching of both the die RDL and the RDLs 3008 and 3014 with a single mask. The spacers 3502 mask the sidewalls of the die RDL 3008 during the second etch. The resulting via openings 3202 have a lower portion with sidewalls that are substantially planar, level, even or aligned with the inner surfaces of the spacers 3502. Furthermore, conductive elements 3010 in the die RDL 3008 may act as etch stop layers while further etching is performed to expose conductive elements 3010 in the wafer RDL 3014. In some embodiments, the spacers 3502 extend from about the bottom surface of the die substrate 3006 to, or above, the top surface of the isolation material 3106.

In alternative embodiments, spacers 3502 may extend fully through the via openings 3202. In such embodiments, the second mask 3302 (see FIG. 33) may be used pattern various features in the device package and extend via openings 3202 to expose the upper surface of conductive elements 3010 in RDLs 3008 and 3014. For example, the etching process used to expose die RDL 3008 (illustrated in FIG. 34) and the subsequent etching process used to expose conductive elements 3010 (illustrated in FIG. 36) may be combined in a single process, and spacers 3502 may be formed as described above after the upper surface of conductive elements 3010 is exposed.

Figure 37:
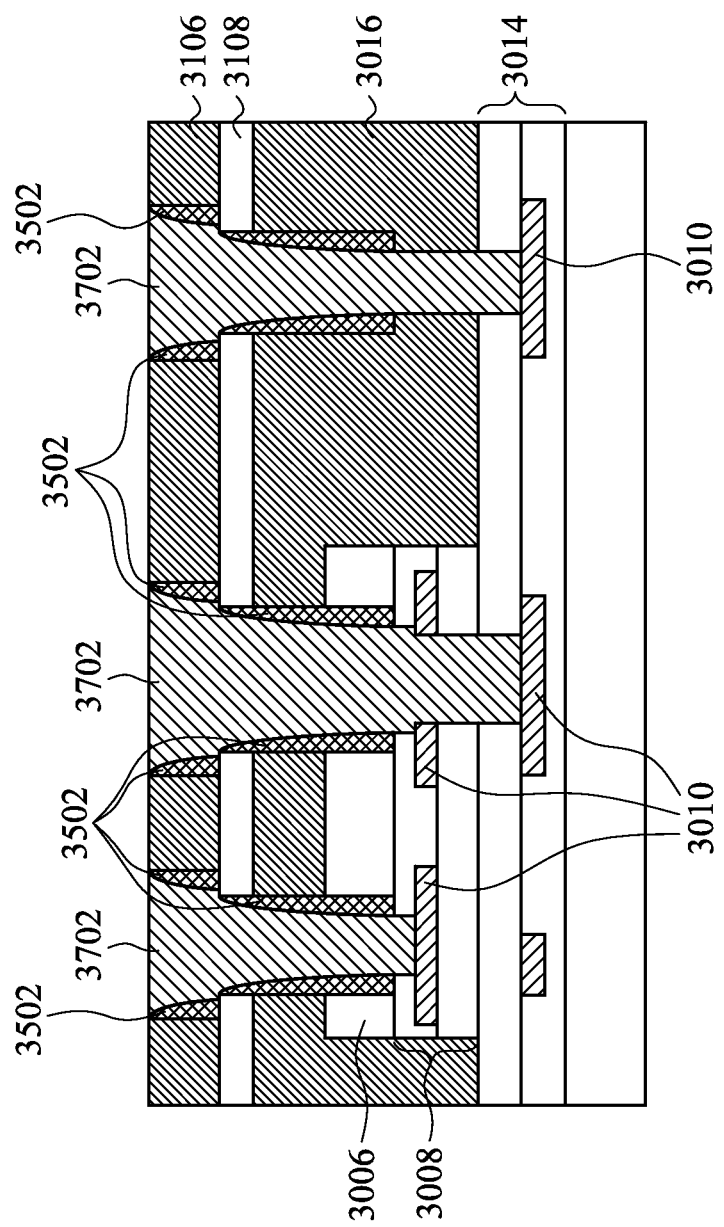

FIG. 37 is a cross-sectional view illustrating formation of vias 3702 in the via openings 3202 according to an embodiment. In some embodiments, the vias 3702 are formed as described above. The vias 3702 are insulated from the die substrate 3006 by the spacers 3502 and extend from the top surface of the isolation material 3106 to the conductive elements 3010. In some embodiments, a barrier layer, seed layer and metal layer are formed in the via openings 3202, and then reduced by CMP or the like.

Figure 38:
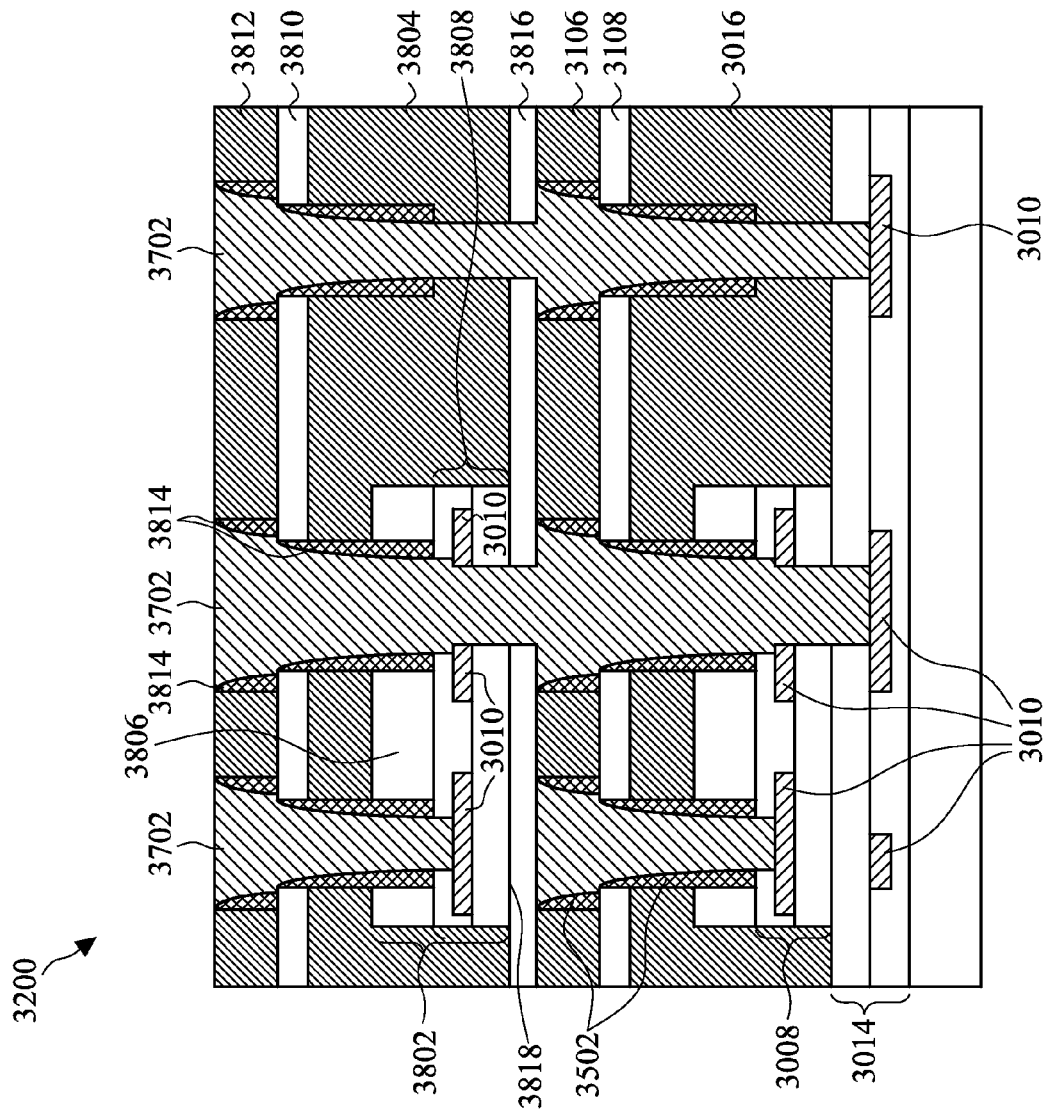

FIG. 38 is a cross-sectional view illustrating the formation of additional dies and conductive features over the isolation material 3106 according to an embodiment. Additional dies may be stacked and bonded to the package illustrated by FIG. 37 to provide additional functions to the device package. A second die 3802 may be bonded to die 3002 and wafer 3014 as described above using an interface layer 3816, for example. In some embodiments, interface layer 3816 may be a dielectric layer (e.g., an oxide) suitable for direct surface bonding such as oxide-to-oxide bonding, hybrid bonding, fusion bonding, or the like. Die 3802 includes a die substrate 3806. A die RDL 3808 is disposed on die substrate 3806 and comprise dielectric layers with conductive elements 3010 disposed therein, some of which are in contact with the active devices in die substrate 3806. The die 3802 is bonded as described above so that the die RDL 3808 and interface layer 3816 are in contact and form a bond interface 3818.

As further illustrated by FIG. 38, an isolation material 3804, an etch stop layer 3810, and an additional isolation material 3812 are formed over die 3802 as described above. Vias 3702 may be extended and/or additional vias 3702 may be formed to contact and electrically connect to conductive elements 3010 disposed in die RDL 3808 as described above. The vias 3702 are insulated from the die substrates 3006 and 3806 by respective self-aligning spacers 3502 and 3814 and extend from the top surface of the isolation material 3812 to the conductive elements 3010. Thus, duel damascene vias may be formed in stacked dies and/or wafers in accordance with an embodiment to form a package 3000 illustrated in FIG. 38.

Figure 39:
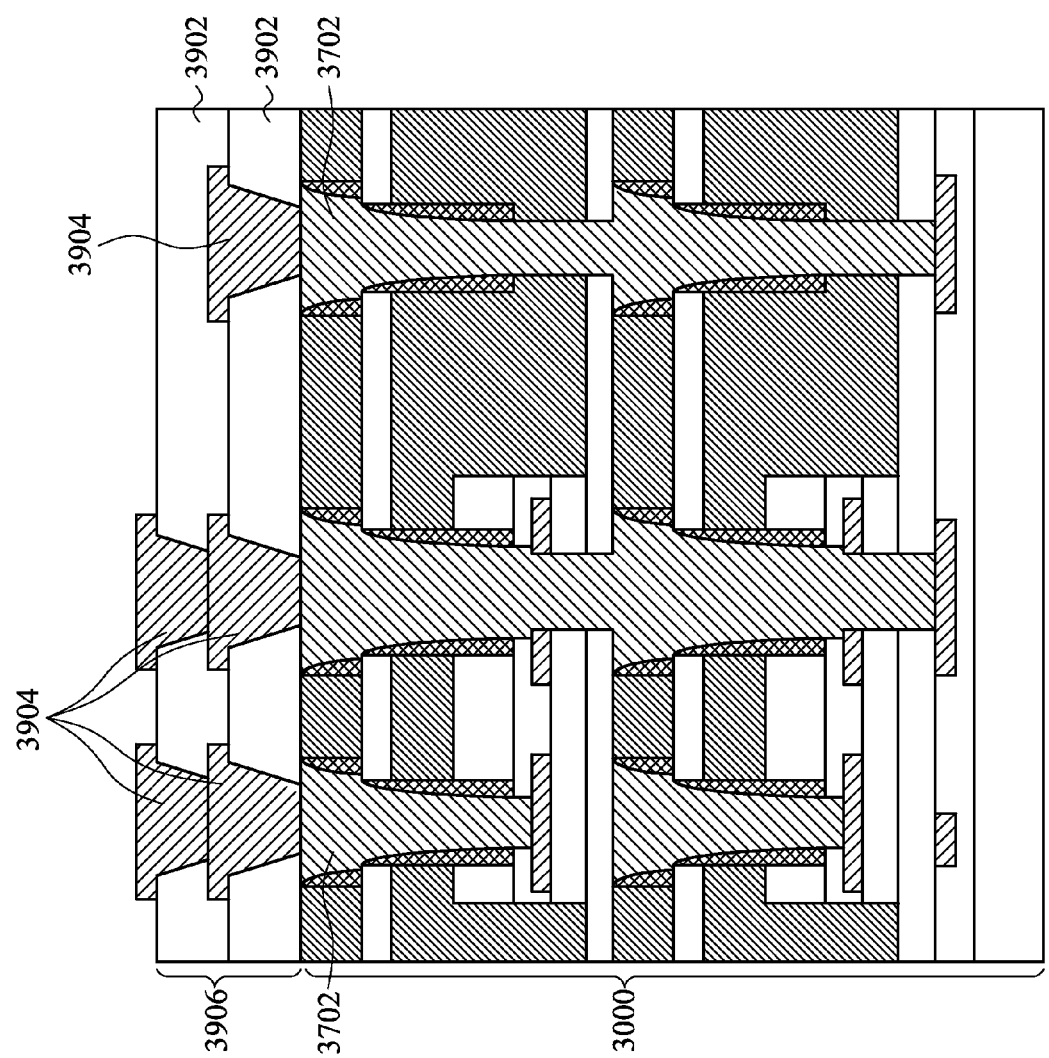

FIGS. 39 through 42 illustrate cross-sectional views of intermediate processing steps in forming additional RDL and fan-out RDL structures for a chip-on-wafer structure package (e.g., package 3000 as illustrated by FIG. 38), permitting bonding to additional package components. FIG. 39 is a cross-sectional view illustrating formation of a top RDL. In some embodiments, the top RDL 3906, with one or more top RDL insulating layers 3902 and conductive elements 3904 are formed as described above. While the conductive elements 3904 in the top RDL 3906 are illustrated as being aligned directly over the lower portions of the vias 3702, it will be understood that the upper portions of the vias 3702 extend, in some embodiments, laterally from the lower potions of the vias. In such embodiments, the top RDL conductive elements 3904 are aligned outside of the lower portions of the vias 3702. Although FIG. 39 illustrates top RDL 3906 formed over package 3000, in other embodiments, top RDL 3906 may be formed over any chip-on-wafer package configuration (e.g., as illustrated in FIGS. 1 through 29).

Figure 40:
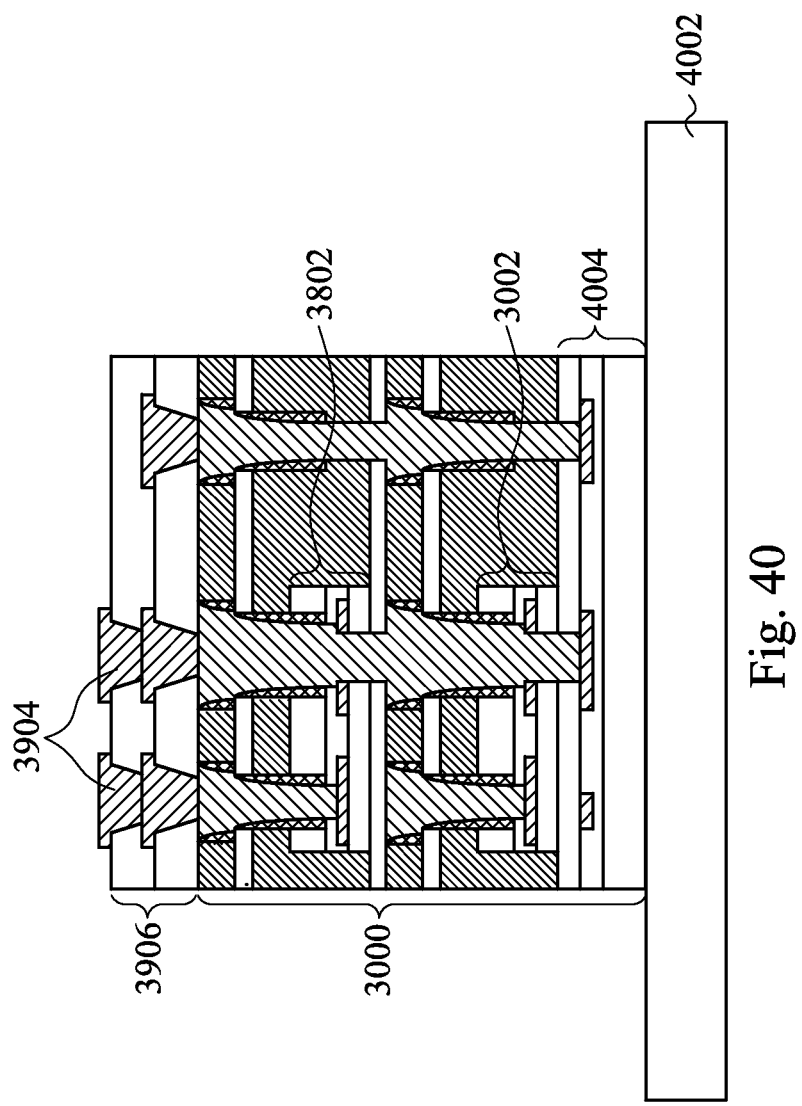
FIGS. 40-42 illustrate cross-sectional views of intermediate processing steps in forming a chip-on-wafer fan-out package structure according to an embodiment.

FIG. 40 is a cross-sectional view of mounting the package 3000 and top RDL 3906 to a carrier 4002 according to an embodiment. For example, package 3000 may be singulated from other packages (not shown) formed over wafer 3004. The resulting singulated package 3000 may include dies 3002, 3802, and 4004 (e.g., singulated portion of wafer 3004), which may have different lateral dimensions. The package/top RDL is attached to the carrier 4002 using die attachment film (DAF), an adhesive, or the like.

Figure 41:
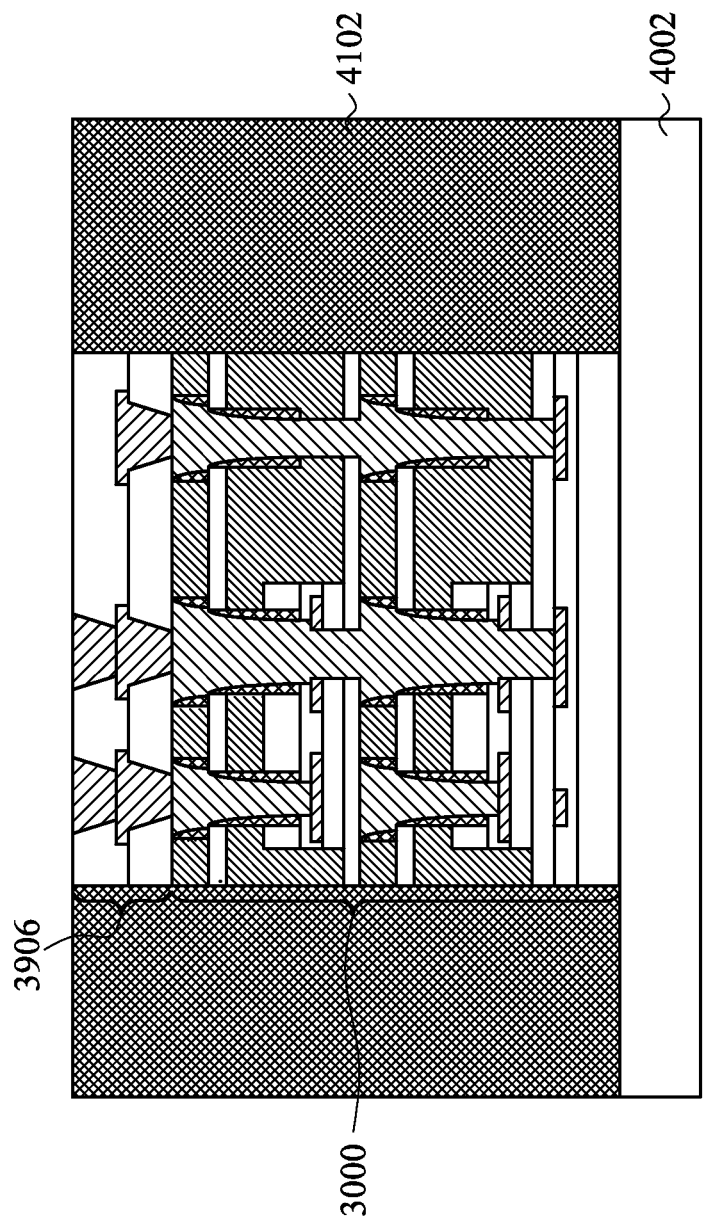

FIG. 41 is a cross-sectional view of forming a molding compound 4102 over the package 3000 and top RDL 3906 according to an embodiment. Molding compound 4102 may be shaped or molded using for example, a mold (not shown) which may have a border or other feature for retaining molding compound 4102 when applied. Such a mold may be used to pressure mold the molding compound 4102 around the package 3000/top RDL 3906 to force the molding compound 4102 into openings and recesses, eliminating air pockets or the like in the molding compound 4102. Subsequently, a curing process is performed to solidify molding compound 4102. Other suitable processes, such as transfer molding, liquid encapsulent molding, and the like, may be used to form molding compound 4102. After the molding compound 4102 is formed, the molding compound 4102 is reduced or planarized by, for example, grinding, a CMP, etching or another process. In some embodiments, molding compound 4102 and a top surface of top RDL 3906 may be substantially level.

Figure 42:
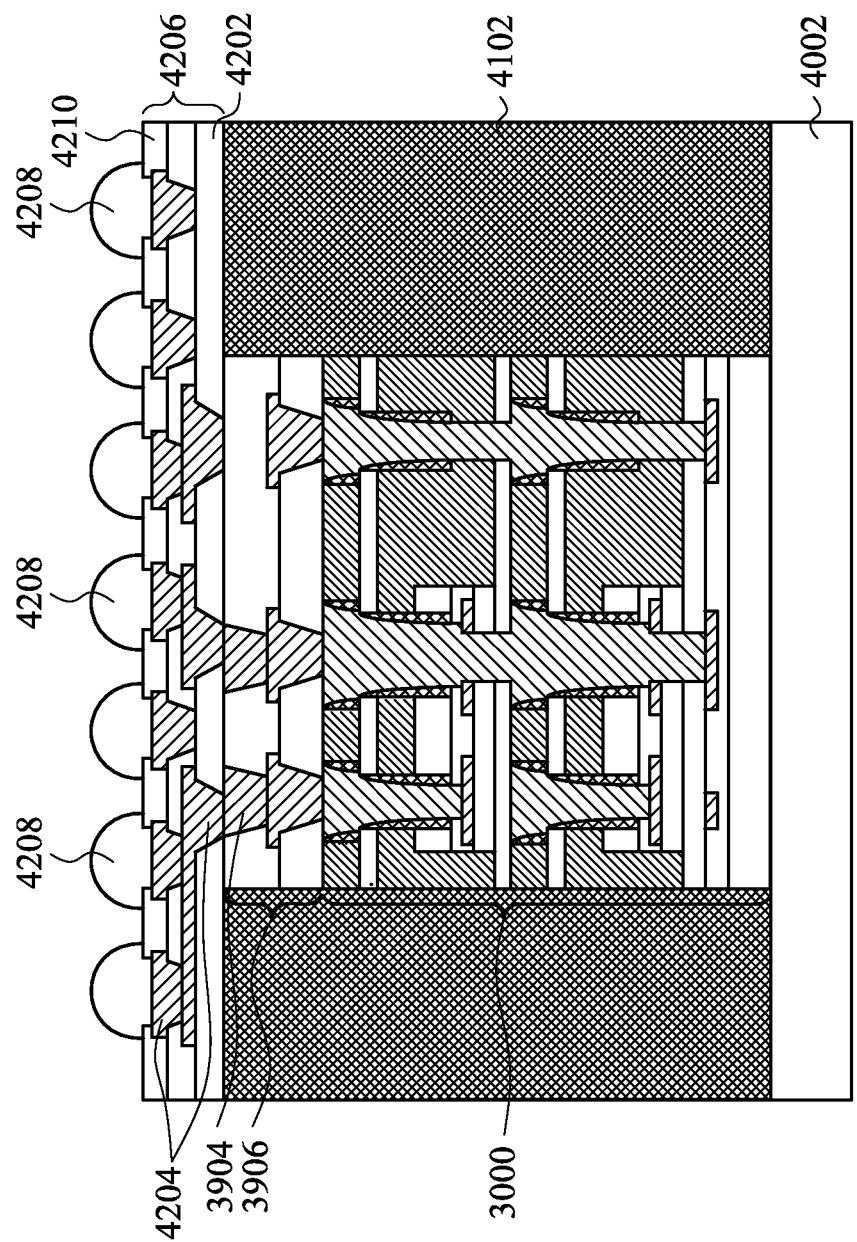

FIG. 42 is a cross-sectional view illustrating formation of a fan-out RDL 4206 over top RDL 3906. In some embodiments, fan-out RDL 4206, with one or more fan-out RDL insulating layers 4202 and conductive elements 4204 are formed as described above. Fan-out RDL 4206 extends laterally past edges of top RDL 3904/package 3000 and may be disposed over molding compound 4102. Additionally, a protective layer 4210 and one or more connectors 4208 are formed over the fan-out RDL 4206 as describe above. Connectors 4208 are used to electrically connect package 3000 to other package components, such as package substrates, other dies, interposers, printed circuit boards, and the like. Thus, various fan-out structures may be formed over a stacked chip-on-wafer package to provide additional I/O structures (e.g., connectors 4208) for bonding to other package components.

Figure 43:
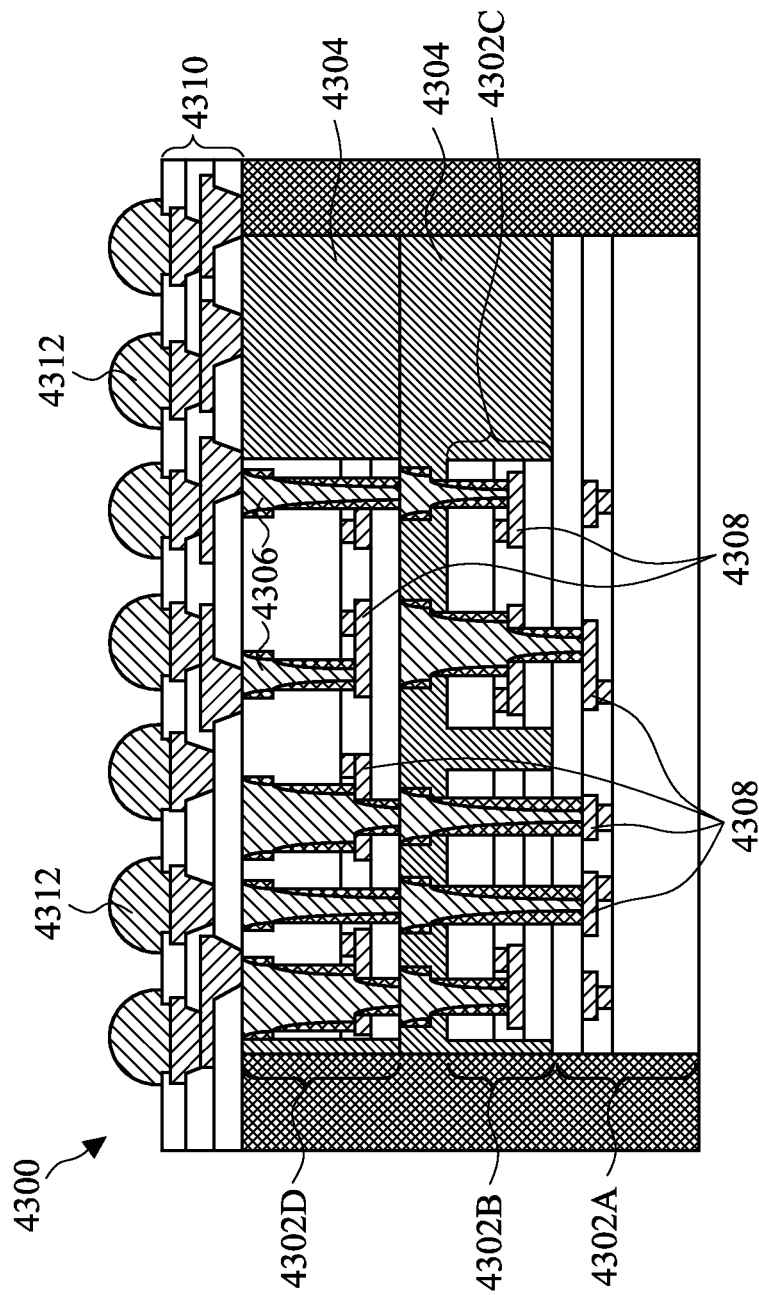
FIGS. 43-46 illustrate cross-sectional views of various chip-on-wafer fan-out package structures according to some embodiments.
Figure 44:
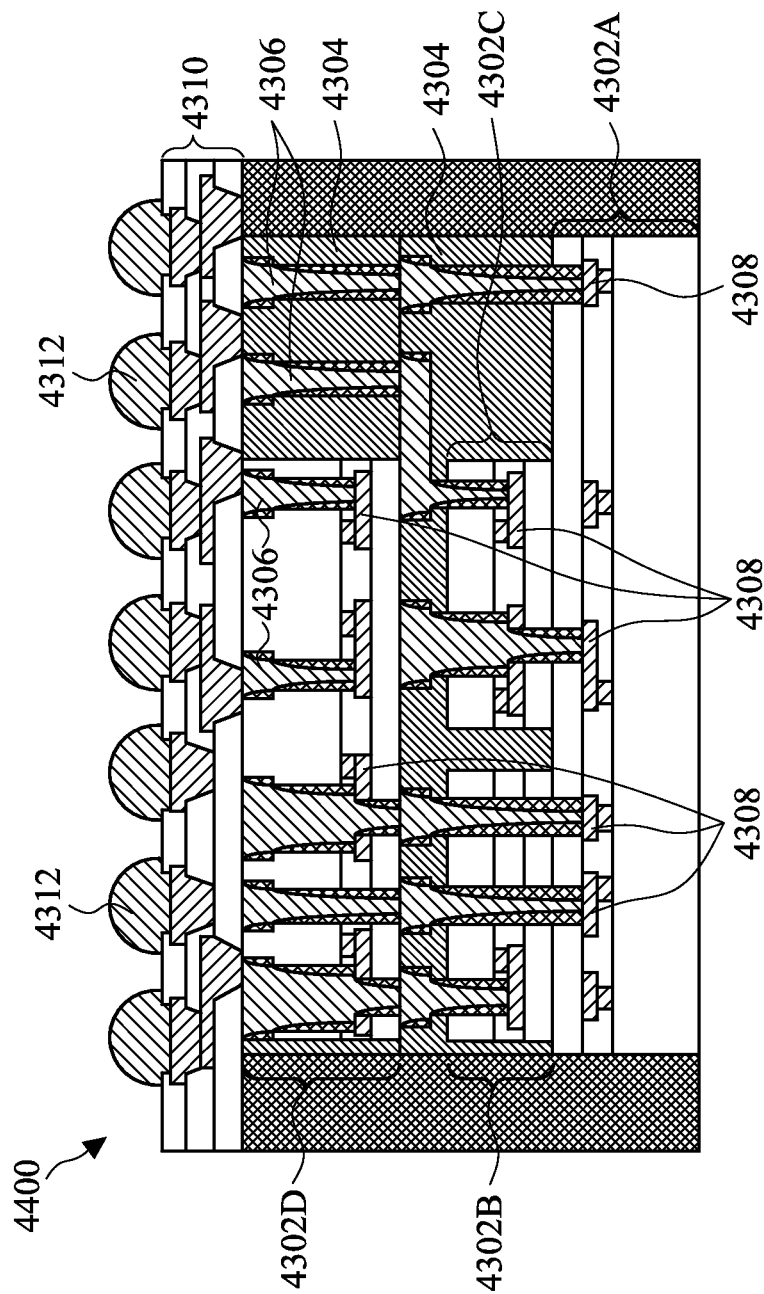

FIGS. 43 and 44 illustrate cross-sectional views of packages 4300 and 4400, respectively in accordance with some alternative embodiments. The packages 4300 and 4400 may be formed in accordance to various chip-on-wafer bonding techniques as described above. Various dies 4302 (labeled 4302A, 4302B, 4302C, and 4302D) may be bonded and stacked in both vertical and lateral configurations. For example, dies 4302B and 4302C may both be bonded to a surface of a die 4302A, and a die 4302D may be disposed over and bonded to dies 4203B and 4302C. Due to the chip-on-wafer bonding techniques used, lateral dimensions of dies 4302 may or may not be the substantially the same.

Various conductive vias 4306 may electrically connect conductive features 4308 in dies 4302A, 4302B, 4302C, and 4302D from any point in the package. Such conductive vias 4306 may be provide vertical interconnects among dies 4302 (e.g., as illustrated by FIG. 43) and/or provide vertical and lateral interconnects among dies 4302 (e.g., as illustrated by FIG. 44). Conductive vias 4306 may extend at least partially through an isolation material 4304, which may be disposed around dies 4302B and 4302C. FIGS. 43 and 44 show but two possible configurations, and in alternative embodiments, the configuration of various dies and conductive vias may vary depending on device design.

Figure 45:
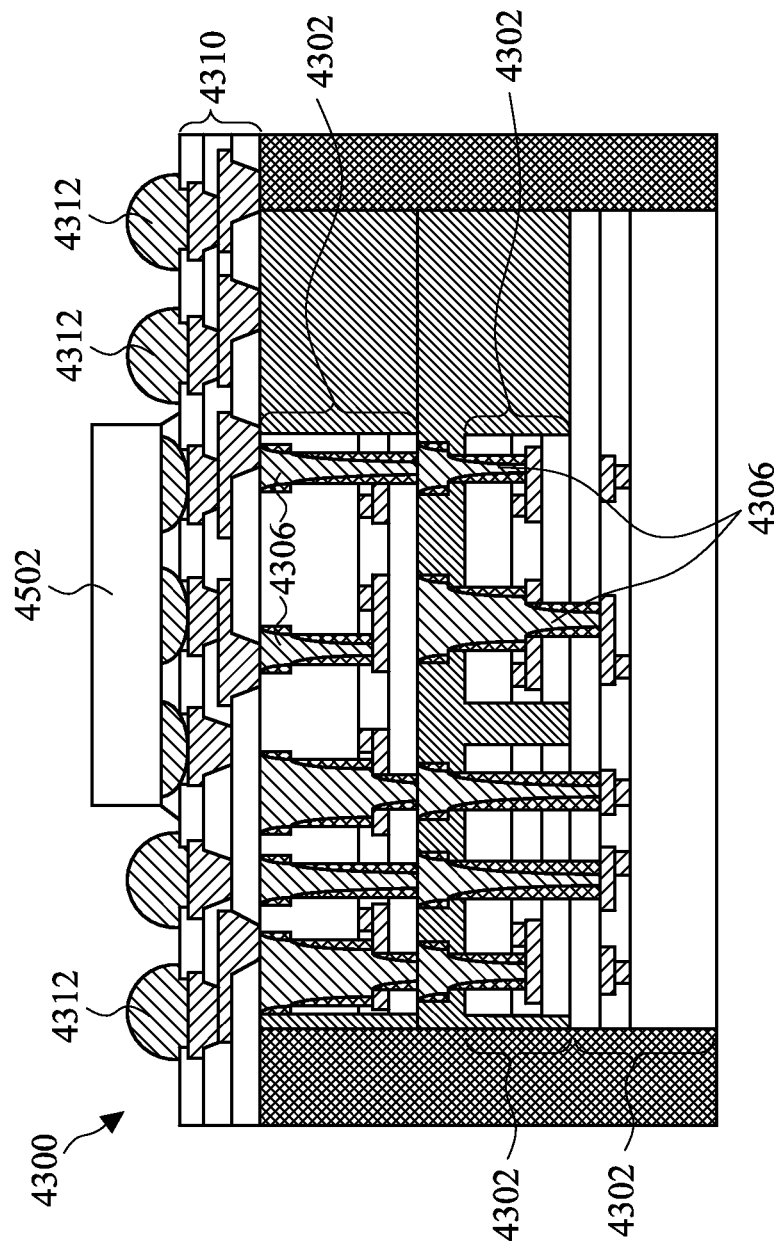
Figure 46:
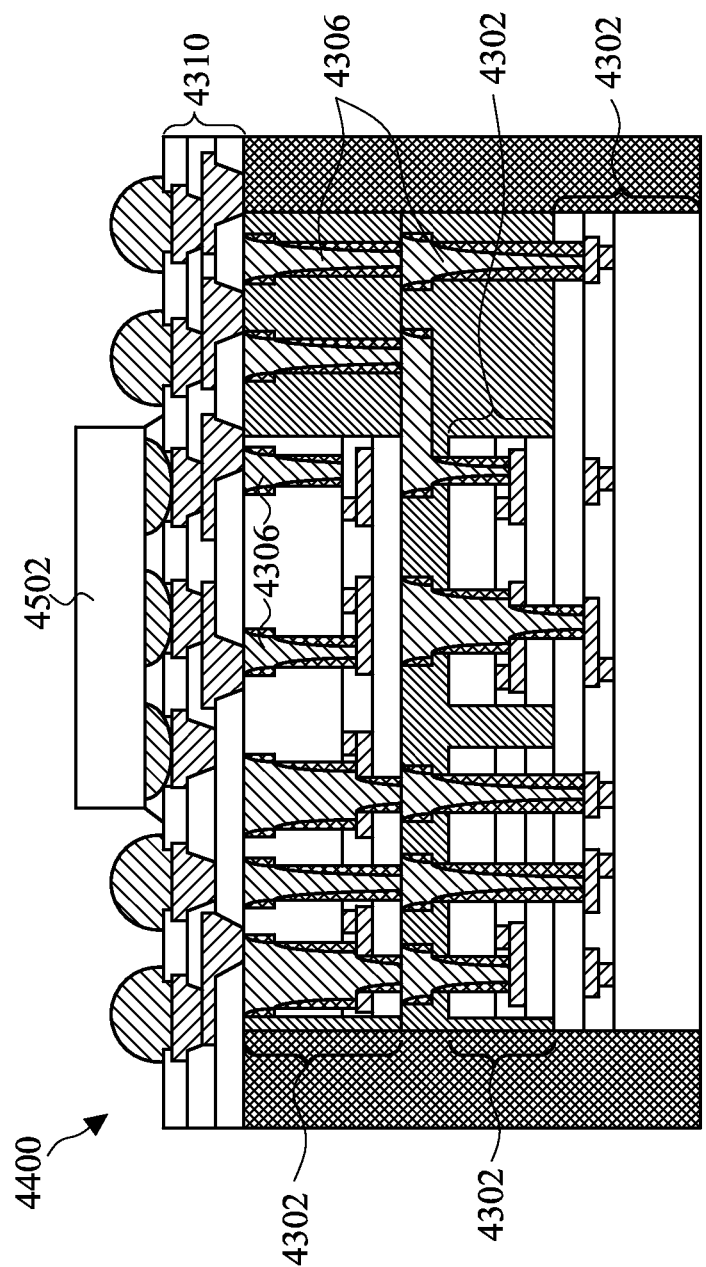

Furthermore, additional package components 4502 (e.g., having additional dies, device packages, interposers, package substrates, and the like) may be bonded to packages 4300 and 4400, for example, as illustrated by FIGS. 45 and 46, respectively. In such embodiments, package components 4502 may be bonded to connectors 4312 on fan-out RDLs 4310, which may be formed over and provide electrically connection to dies 4302 and conductive vias 4306.

Figure 47A:
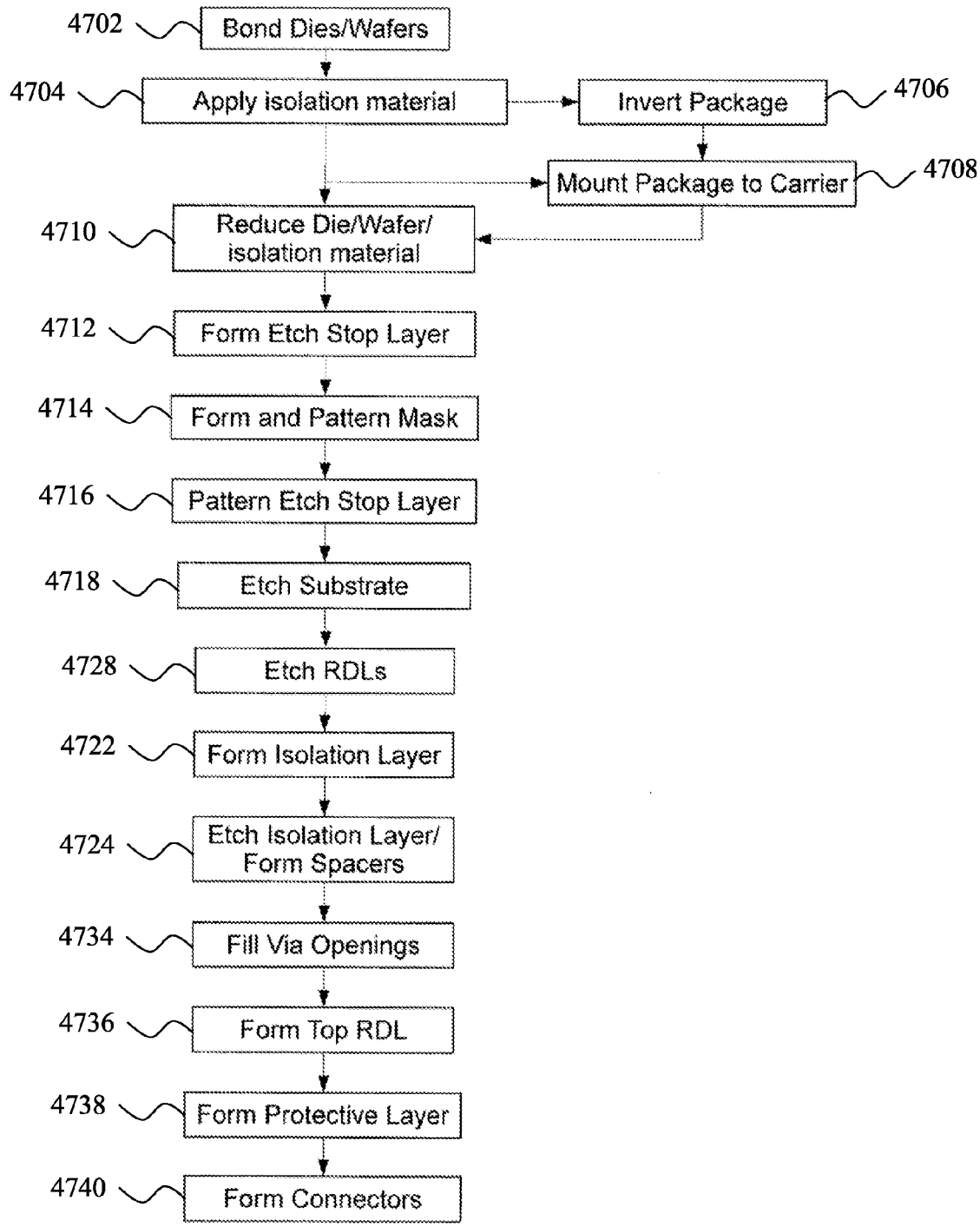
FIGS. 47A-47D are flow diagrams illustrating methods of forming chip-on-wafer structures according to some embodiments.

FIG. 47A is a flow diagram illustrating a method 4700 of forming chip-on-wafer structures according to some embodiments. Initially one or more dies are bonded to a wafer in block 4702, or two wafers are bonded together. An isolation material is formed over the bonded die and wafer in block 4704. In some embodiments, the package is inverted in block 4706 and mounted to a carrier in block 4708. The package is reduced by CMP, grinding, polishing or otherwise reducing the die, wafer, or isolation material on block 4710. In some embodiments, an etch stop layer is formed in block 4712. A first mask is formed and patterned in block 4714 and the etch stop layer is patterned in block 4716. The substrate of the die or wafer is etched in block 4718 and the RDLs between the wafer and die are etched in block 4726. The isolation layer is formed in block 4722 and etched to form the spacers in block 4724. Via openings formed by the etching are filled with a conductive material in block 4734. A top RDL is formed in block 4736. In some embodiments, a protective layer is formed over the top RDL in block 4738. Connectors are formed over the top RDL in contact with conductive elements of the top RDL in block 4740. Alternatively, fan-out RDLs may be formed extending laterally past edges of the top RDL, and the connectors of block 4740 may be formed over the fan-out RDL in contact with conductive elements of the fan-out RDL.

Figure 47B:
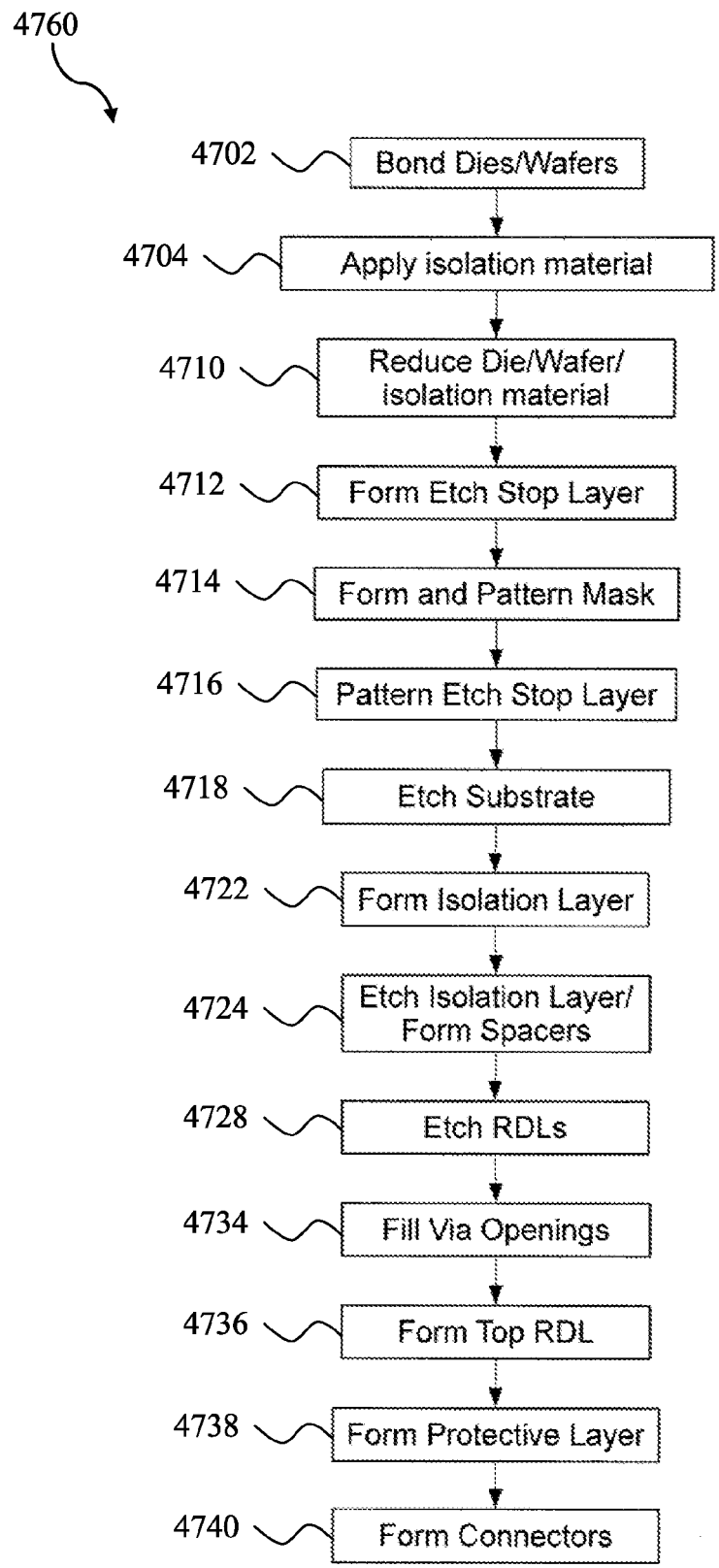

FIG. 47B is a flow diagram illustrating a method 4760 of forming chip-on-wafer structures according to other embodiments. In such embodiments, partial height spacers are formed by a process similar to that described above. In some embodiments, the step of inverting the package and mounting the package to a carrier is skipped. Additionally, the isolation layer is formed in block 4722 after etching the substrate in block 4718. The isolation layer is etched in block 4724, and the RDLs are etched in block 4726 using the spacers as masks for etching the RDLs. The via openings formed by the etching are then filled in block 4734, and the process continues as described above.

Figure 47C:
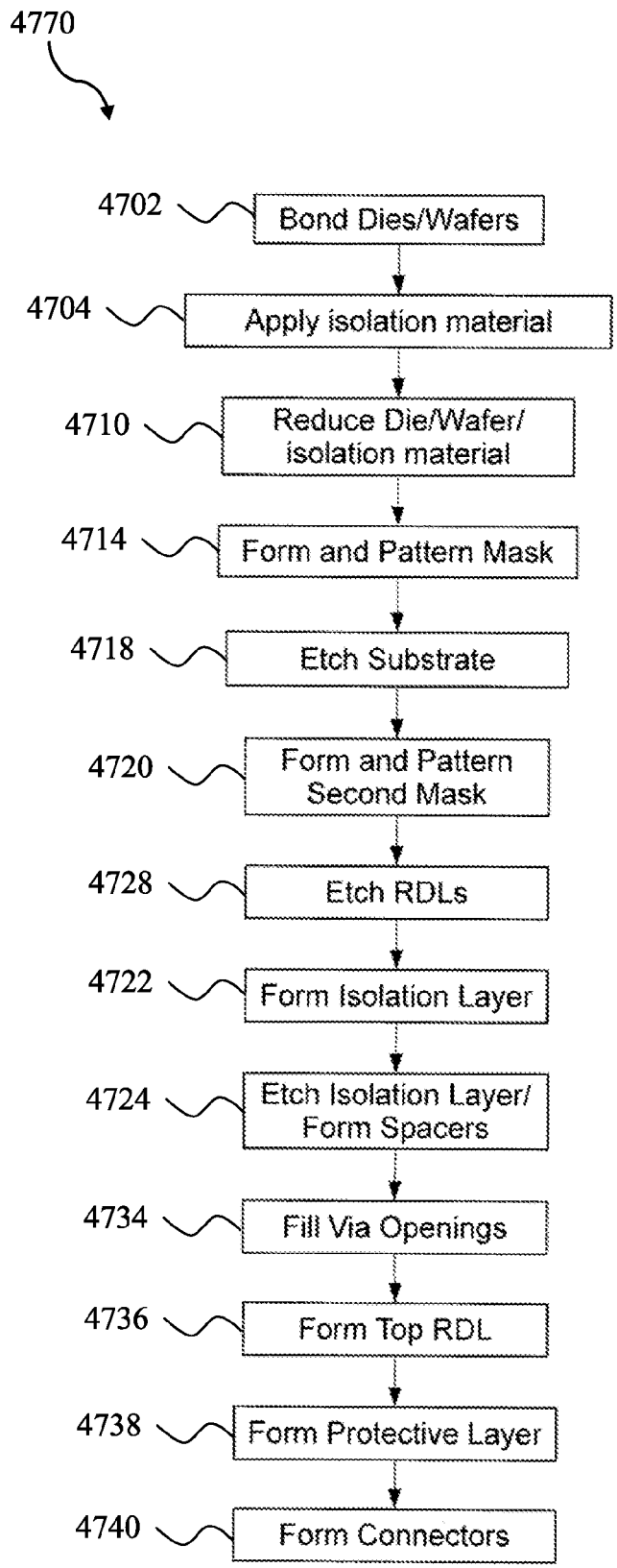

FIG. 47C is a flow diagram illustrating a method 4770 of forming chip-on-wafer structures according to other embodiments. In such embodiments, a dual damascene technique is used to form vias with upper portions that are wider than, or extend laterally from, the lower portions of the vias. In some embodiments, the substrate is etched in block 4718, and a second mask is formed and patterned in block 4720. The RDLs are etched in block 4728, with the second mask defining the upper portions of the via openings. The isolation layer is formed in block 4722, and the process continues as described above.

Figure 47D:
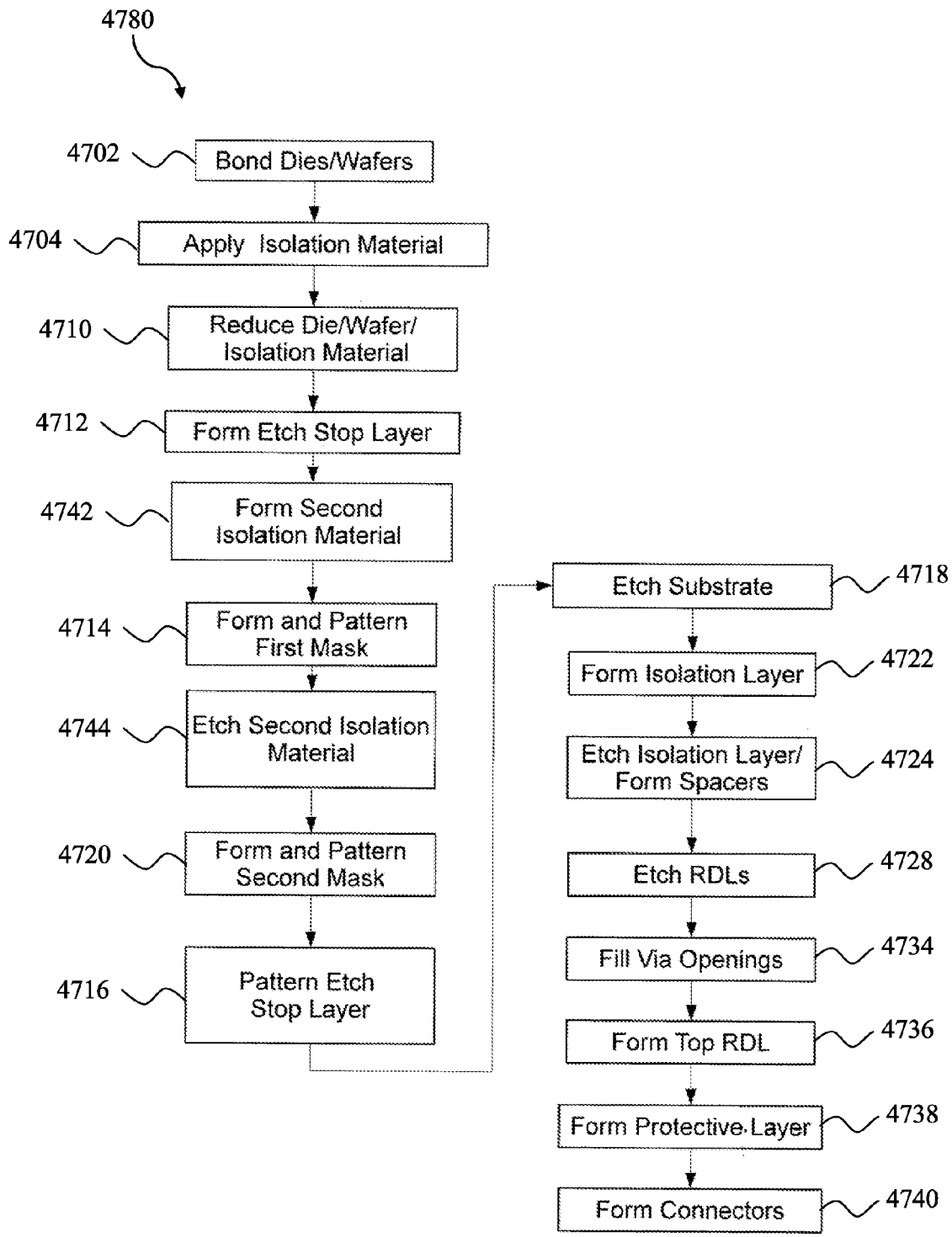

FIG. 47D is a flow diagram illustrating a method 4780 of forming chip-on-wafer structures according to other embodiments. In such embodiments, a dual damascene technique is used to form vias with upper portions that are wider than, or extend laterally from, the lower portions of the vias using an alternative method as method 4770 of FIG. 31C. In some embodiments, an etch stop layer is formed over the isolation material in block 4712, and a second isolation material is formed over the etch stop layer in block 4742. A first mask is formed and patterned in block 4714, and the second isolation material is etched in block 4744. A second mask is formed and patterned in block 4720, with the second mask being used to mask off portions of patterned openings in the second isolation material. In blocks 4716 and 4718, the etch stop layer and the substrate are etched, respectively. An isolation layer is formed in block 4722, and the isolation layer is etched to form spacers in block 4724. The RDLs are etched in block 4728, with the first mask defining the upper portions of the via openings and the second mask defining the lower portions of the via openings. The via openings formed by the etching are then filled in block 4734, and the process continues as described above.

Thus, a package according to an embodiment includes a first device package and a fan-out RDL disposed over the first device package. The fan-out RDL extends past edges of the first device package. The first device package comprises a first die having a first redistribution layer (RDL) disposed on a first substrate, a second die having a second RDL disposed on a second substrate, an isolation material over the first die and extending along sidewalls of the second die, and a conductive via. The first RDL is bonded to the second RDL, and the first die and the second die comprise different lateral dimensions. At least a portion of the conductive via extends from a top surface of the isolation material to contact a first conductive element in the first RDL.

According to another embodiment, a package includes a first package component, a molding compound extending along sidewalls of the first package component, a fan-out RDL extending laterally past an edge of the first package component, and a second package component bonded to the fan-out RDL. The first package component includes a first die comprising a first redistribution layer (RDL) disposed on a first substrate, a second die bonded to the first die, a first isolation material disposed around the second die, and a conductive via extending through the second substrate and contacting a conductive element in the first RDL or in the second RDL. The second die comprises a second RDL disposed on a second substrate. A bottom surface of the isolation material is substantially level with a top surface of the first die.

A method according to an embodiment comprises providing a die having a first redistribution layer (RDL) on a first substrate, providing a wafer having a second RDL on a second substrate, and directly bonding the first RDL to the second RDL. The method further comprises forming a first isolation material over the wafer and around the die and forming a conductive via extending from a top surface of the first isolation material to contact a first conductive element in the first RDL or the second RDL. Forming the conductive via comprises patterning an opening, extending the opening to expose the first conductive element, and filling the opening with a conductive material. Extending the opening comprises masking off a portion of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first device package comprising:
        a first die having a first redistribution layer (RDL) disposed on a first substrate;
        a second die having a second RDL disposed on a second substrate, the first RDL bonded to the second RDL, wherein the first die and the second die comprise different lateral dimensions;
        an isolation material over the first die and extending along sidewalls of the second die; and
        a conductive via, wherein at least a portion of the conductive via extends from a top surface of the isolation material to contact a first conductive element in the first RDL; and
    a fan-out RDL disposed over the first device package, wherein the fan-out RDL extends past edges of the first device package.

2. The package of claim 1, wherein the first RDL is directly bonded to the second RDL.

3. The package of claim 1, wherein the conductive via extends through and is electrically isolated from the second substrate, wherein the first device package further comprises a first spacer disposed between the second substrate and the conductive via.

4. The package of claim 3, wherein a first vertical dimension of the first spacer is less than a second vertical dimension of the conductive via.

5. The package of claim 1, further comprising another package component bonded to an opposing side of the fan-out RDL as the first device package.

6. The package of claim 1, wherein the conductive via further contacts a second conductive element in the second RDL.

7. The package of claim 1, wherein the first device package further comprises a third RDL over the isolation material, and wherein the third RDL electrically connects the first conductive element in the first RDL to a second conductive element in the second RDL.

8. The package of claim 1, wherein the isolation material comprises an oxide or a nitride.

9. A package comprising:
    a first package component comprising:
        a first die comprising a first redistribution layer (RDL) disposed on a first substrate;
        a second die bonded to the first die, wherein the second die comprises a second RDL disposed on a second substrate;
        a first isolation material disposed around the second die, wherein a bottom surface of the first isolation material is substantially level with a top surface of the first die; and
        a first conductive via extending through the second substrate and contacting a first conductive element in the first RDL or a second conductive element in the second RDL;
    a molding compound extending along sidewalls of the first package component;
    a fan-out RDL extending laterally past an edge of the first package component; and
    a second package component bonded to the fan-out RDL.

10. The package of claim 9, wherein the first RDL is bonded directly to the second RDL.

11. The package of claim 9, wherein the first package component further comprises:
    a third die comprising a third RDL disposed on a third substrate, wherein the first isolation material is further disposed around the third die; and
    a second conductive via extending through the third substrate and contacting a third conductive element in the third RDL.

12. The package of claim 9, wherein the first package component further comprises:
    a fourth die comprising a fourth RDL disposed on a fourth substrate, wherein the fourth die is disposed over the first isolation material; and a third conductive via extending through the fourth substrate and contacting a fourth conductive element in the fourth RDL.

13. The package of claim 9, wherein the first package component further comprises a fourth conductive via extending through the first isolation material and contacting a fifth conductive element in the first RDL.

14. The package of claim 9, wherein the first package component further comprises an etch stop layer over the first isolation material and a second isolation material over the etch stop layer, wherein the first conductive via extends through the etch stop layer and the second isolation material.

15. The package of claim 14, wherein the first conductive via comprises a dual damascene structure.

16. A package comprising:
a first die directly bonded to a second die;
a first isolation material over the first die and the second die, wherein the first isolation material further surrounds the first die;
an etch stop layer over the first isolation material;
a second isolation material over the etch stop layer;
a conductive via extending through the first isolation material, the etch stop layer, and the second isolation material to contact a first conductive feature in the first die and a second conductive feature in the second die;
a spacer on at least a first portion of a sidewall of the conductive via; and
fan-out redistribution layers (RDLs) over and extending past edges of the second isolation material, wherein the fan-out RDLs is electrically connected to the first die and the second die through the conductive via.

17. The package of claim 16, wherein the spacer is not disposed on a second portion of the sidewall of the conductive via.

18. The package of claim 16, wherein the conductive via is wider in the second isolation material than in the first isolation material, and wherein the conductive via is wider in the first isolation material than in the second die.

19. The package of claim 16 further comprising a molding compound extending along sidewalls of the first isolation material, the etch stop layer, and the second isolation material.

20. The package of claim 16 further comprising:
an additional conductive via adjacent the first die extending through the first isolation material, the etch stop layer, and the second isolation material, wherein the additional conductive via contacts a third conductive feature in the second die; and
an additional spacer extending at least partially along a sidewall of the additional conductive via.

* * * * *